United States Patent [19]
Seibel et al.

[11] Patent Number: 5,016,202
[45] Date of Patent: May 14, 1991

[54] INTERPOLATED SWEPT PARAMETER SYSTEM FOR SYNTHESIZED SWEEPER

[75] Inventors: Michael J. Seibel, Windsor; Douglas E. Fullmer, Santa Rosa; James E. Bossaller, Rohnert Park; Glen M. Baker, Santa Rosa, all of Calif.

[73] Assignee: Hewlett-Packard Company, Palo Alto, Calif.

[21] Appl. No.: 414,556

[22] Filed: Sep. 29, 1989

[51] Int. Cl.$^5$ ............................................. G01R 35/00
[52] U.S. Cl. ................................ 364/571.07; 364/577; 331/4
[58] Field of Search ....................... 331/4, 14; 364/484, 364/485, 571.01, 571.04, 571.07, 577; 324/77 CS

[56] References Cited
U.S. PATENT DOCUMENTS

| | | | |
|---|---|---|---|
| 3,576,498 | 4/1971 | Hirsch | 331/4 |
| 4,342,007 | 7/1982 | Elliot | 331/4 |
| 4,647,873 | 3/1987 | Beckner et al. | 331/4 |

*Primary Examiner*—Salvatore Cangialosi
*Attorney, Agent, or Firm*—William C. Milks, III

[57] ABSTRACT

A swept synthesizer signal source provides a digital synchronization signal for accurate internal synchronization of events and for external synchronization of data taking and other operations to predetermined frequencies generated by an oscillator during a sweep. The digital synchronization signal includes a predetermined number of digital pulses, regardless of the sweep time. A ramp voltage which controls the oscillator is corrected during a calibration period to sweep between predetermined limits, thereby insuring that the ramp voltage is synchronized to the digital synchronization signal. The slope of the frequency versus time sweep is also corrected to further improve accuracy. A power level correction technique insures precision power leveling regardless of the sweep range. A table of correction/frequency pairs is entered into the instrument, and an interpolation algorithm is employed to determine corrections at frequencies correponding to each synchronization pulse. The source can be used in a network analyzer system wherein the synchronization pulses are provided to a receiver to trigger data taking. Two or more sources can be interconnected to provide synchronized sweeps.

17 Claims, 19 Drawing Sheets

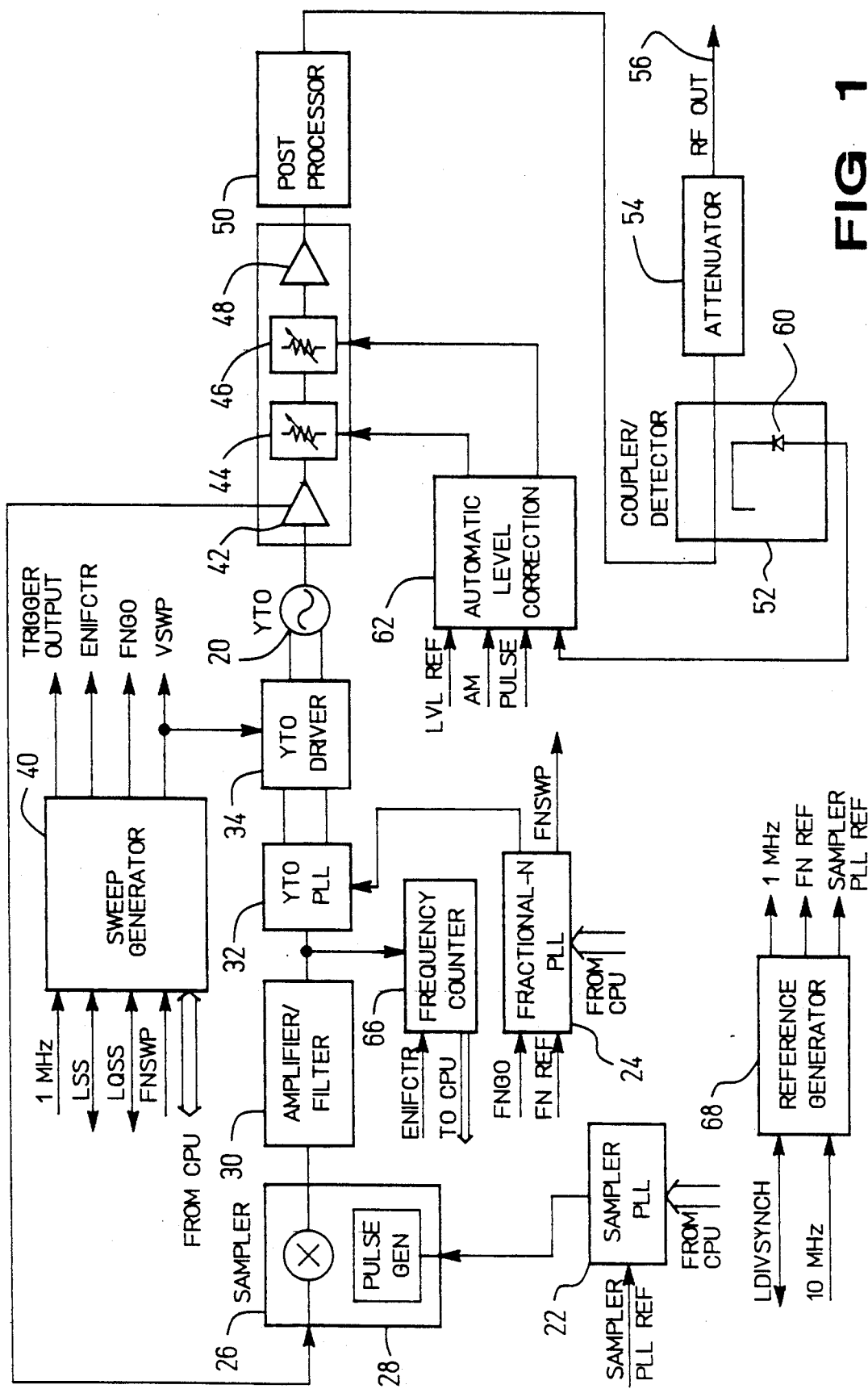

INTERPOLATED SWEPT PARAMETER SYSTEM FOR SYNTHESIZED SWEEPER

FIELD OF THE INVENTION

This invention relates to swept-frequency signal sources and, more particularly, to a method and apparatus for interpolated correction of frequency-dependent parameters in a synthesized sweeper. The invention is particularly useful for providing an ultraflat power level during a sweep, but is not limited to such use.

BACKGROUND OF THE INVENTION

Sweep signal sources are well known in the art for a variety of test and measurement purposes. Typically, the frequency of a source is swept continuously or in steps between preselected start and stop frequencies. State of the art sweep signal sources operate over frequency ranges on the order of 10 megahertz to 40 gigahertz. Phase locked loop frequency synthesizers are used to provide highly accurate, stable output frequencies. Typical features include continuous or stepped sweeps, selectable start and stop frequencies, and selectable sweep times.

A frequent use of sweep signal sources is in network analyzer systems. A vector network analyzer system contains several elements. A first element is the signal source to provide a stimulus to a device under test (DUT). A second element is a signal separation network to route the stimulus to the DUT and to provide a means for sampling the energy that is reflected from or transmitted through the DUT. Also, energy from the signal that is incident upon the DUT is sampled in order to provide a reference for relative measurements. A third element is a tuned receiver to convert the resulting signals to intermediate frequencies for further processing. The magnitude and phase relationships of the original signals must be maintained through the frequency conversion to intermediate frequency to provide usable measurements. A fourth element is a detector to detect the magnitude and phase characteristics of the intermediate frequency signals, and a fifth element is a display on which to present the measurement results.

In a network analyzer system, it is necessary to synchronize the operations of the receiver to those of the source. The receiver and signal processing portions of the system take data or measurements at a number of frequencies during a sweep. The data must be precisely correlated to the frequencies at which it was taken in order to provide accurate measurements. In addition, network analyzer systems often employ markers to indicate selected frequencies on a display. In order to ensure that the markers appear at the selected frequencies, the receiver must determine when the source sweeps through that frequency. Depending on the selected start and stop frequencies, the signal source may change bands during a sweep by activating different oscillator and/or frequency multiplier configurations. When bands are changed, the sweep is temporarily stopped. The receiver must be notified when a stop sweep occurs in order to maintain synchronization.

It is customary to generate continuous frequency sweeps by applying a continuously increasing or decreasing ramp voltage to the tuning input of a voltage controlled oscillator. Although the ramp voltage can be initiated by a synchronizing signal, the ramp voltage is subject to errors from a number of sources, including timing capacitor and timing resistor tolerances, reference voltage variations, temperature variations and component aging. Furthermore, different components and different voltages are used to generate the ramp voltage, depending on the selected sweep time. When the ramp voltage is in error, the synchronizing signals have an imprecise time relationship to the ramp voltage. Consequently, operations that are synchronized to such signals are not synchronized to the sweep.

In order to reduce such errors and to more accurately synchronize operations to the frequency sweep, it is known to convert the ramp voltage into a digital pulse train using an analog-to-digital converter. Each time the ramp voltage changes by a predetermined amount, a digital pulse is generated. Thus, the synchronizing signal is generated directly from the ramp voltage. This technique is described in U.S. Pat. No. 4,641,086 issued Feb. 3, 1987 to Barr, IV et al and is implemented in the Model 8340 signal source and Model 8510 receiver, both manufactured and sold by Hewlett Packard Company. While this technique provides satisfactory performance, it is subject to errors in the analog to-digital converter which converts the ramp voltage to a digital pulse train.

Swept synthesizers sometimes generate frequency sweeps using a technique known as fractional-N sweeps. In fractional-N phase locked loops, the divider ratio is changed on the fly during a sweep, and phase errors are corrected using analog phase interpolation. The output is a phase locked analog frequency sweep. Such sweeps are generated without the use of a ramp voltage. Thus, it is highly inaccurate to synchronize the receiver by conversion of a ramp voltage to a pulse train when fractional-N sweeps are employed.

Accuracy is a factor of primary importance for sweep signal sources, as for other test instruments. In order to provide accurate measurements, it is necessary to know both the frequency and the power level at each measurement point in a sweep. The discussion hereinabove regarding synchronization of operations relates to accurate determination of frequency. It is also important to provide a known power level at each measurement point.

Although sweep signal sources are designed to provide constant output power levels during a frequency sweep, it is well known that microwave power levels vary drastically with frequency due to parasitic impedances of interconnecting cables, circuit components and the like. Typically, the power level decreases with increasing frequency. It is desirable to compensate for such power level variations as a function of frequency and to provide a constant power level, either at the output of the signal source or at a remote measurement location.

In many cases, the output of the signal source passes through cables, couplers and other components before reaching a device under test. Accurate evaluation of the device under test requires a comparison of its output with its input at specified frequencies. Thus, it is often important to provide a constant or flat power level at the remote location where the device under test is located.

It is known in the art to provide power level correction based on a fixed number of correction points in the sweep range of the instrument. When a sweep is performed, the output level is corrected in accordance with the stored corrections. However, the fixed correction points are unlikely to correspond to the measurement points during a sweep when the start and stop frequencies of a sweep are selectable. Furthermore, for short sweeps the entire sweep may fall between two of the fixed correction points. In these cases, high accuracy power leveling is not achieved.

It is a general object of the present invention to provide improved sweep frequency sources.

It is another object of the present invention to provide digitally synchronized sweep frequency sources.

It is yet another object of the present invention to provide highly accurate sweep sources.

It is a further object of the present invention to provide a sweep frequency source which generates a constant power level at a specified location during a frequency sweep.

It is yet another object of the present invention to provide methods and apparatus for interpolated swept parameter correction in sweep frequency sources.

It is still another object of the present invention to automatically provide parameter corrections at each measurement point in a selected frequency sweep.

SUMMARY OF THE INVENTION

According to the present invention, these and other objects and advantages are achieved in methods and apparatus for correcting a frequency-dependent parameter in a swept frequency signal source having selectable start and stop frequencies. The method comprises the steps of storing a first table of parameter correction values corresponding to a set of first frequencies within the sweep range of the signal source, defining a set of second frequencies between a selected start frequency and a selected stop frequency of a sweep, calculating a correction value for each of the second frequencies from the first table of correction values, the correction values for each of the second frequencies constituting a second table of parameter correction values, and correcting the parameter as the signal source is swept between the start and stop frequencies using the second table of correction values. The correction technique is preferably utilized to provide a constant power level during a sweep, but is not limited to such use.

The parameter correction technique is preferably utilized in a digitally synchronized signal source. A digital synchronization signal including a predetermined number of digital pulses is generated during a sweep. The sweep is precisely synchronized to the digital synchronization signal. One of the second frequencies is synchronized to each of the digital pulses. The digital synchronization pulses are utilized to trigger data taking during a sweep. Thus, the parameter correction values in the second table correspond exactly to the measurement points.

A linear interpolation technique is utilized for calculating the parameter correction values at each of the second frequencies. The second table of parameter correction values is stored in a memory, and the memory is sequentially addressed during a sweep upon the occurrence of the digital synchronization pulses. The parameter correction values that are read out from the memory are applied to a level correction circuit to thereby provide the desired power level at each of the second frequencies.

An efficient linear interpolation algorithm is used to calculate the second table of correction values. The correction values are calculated in sequence across a sweep. A correction value at a first one of the second frequencies is calculated by linear interpolation between a first correction value and a second correction value in the first table. The first and second correction values are the closest frequencies above and below the first one of the second frequencies. Then, a change in correction values between adjacent second frequencies is calculated. The change in correction values corresponds to the slope of a line joining the first and second correction values in the first table. After determining the first correction value, subsequent correction values are determined by adding the change in correction value to the previously-calculated correction value until the second frequency exceeds the closest frequency in the first table. Then, it is necessary to again select the closest correction values in the first table and calculate a correction value by linear interpolation.

BRIEF DESCRIPTION OF THE DRAWINGS

For a better understanding of the present invention together with other and further objects, advantages and capabilities thereof, reference is made to the accompanying drawings which are incorporated herein by reference and in which:

FIG. 1 is a simplified block diagram of a swept synthesizer in accordance with the present invention;

DETAILED DESCRIPTION OF THE INVENTION

Figure 2A:
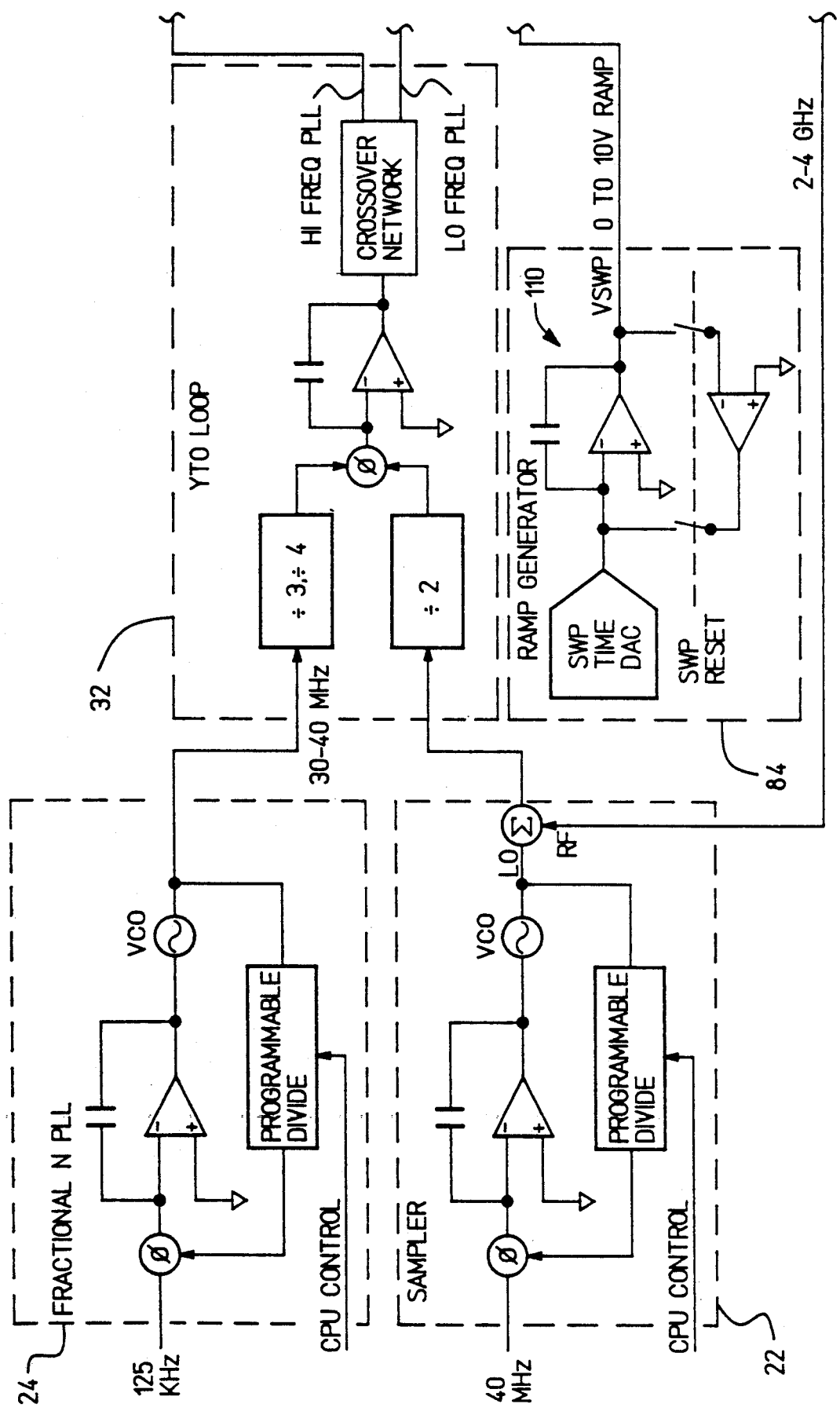
FIG. 2 is a simplified block diagram of the frequency synthesizer used in the system of FIG. 1.

A block diagram of a swept synthesizer which incorporates the present invention is shown in FIG. 1. The swept synthesizer is a signal generator, or signal source, in which the frequency can be swept between selected limits within a wide operating range, typically 10 megahertz to 40 gigahertz. The basic oscillator for the source is a YIG tuned oscillator (YTO) 20. YIG tuned oscillators are commonly used in swept microwave signal sources. The YTO 20 is phase locked to an ultra-precise 10 megahertz reference frequency using a sampler phase locked loop 22 and a fractional-N phase locked loop 24, both of which are phase locked to the reference frequency.

The output of the YTO 20 is connected to one input of a sampler 26. The sampler phase locked loop 22 is coupled to a pulse generator 28 in sampler 26. The output of sampler 26 is coupled through an amplifier/filter 30 which selects one of the products which results from mixing the YTO 20 output with one of the harmonics of the sampler phase locked loop 22 output. The output of amplifier/filter 30 is an intermediate frequency (IF), typically in the range of about 15–40 megahertz. The outputs of amplifier/filter 30 and fractional-N phase locked loop 24 are coupled to a YTO phase locked loop 32. The output of YTO phase locked loop 32 is coupled through a YTO driver 34 to YTO 20 to thereby close the frequency synthesis loop.

A desired frequency is generated by selecting appropriate divider ratios in sampler phase locked loop 22 and fractional-N phase locked loop 24. Phase locked loop frequency synthesis techniques are generally known in the art and will not be described in further detail. A similar frequency synthesis technique is used in the Model 8340 swept synthesizer manufactured and sold by Hewlett Packard Company.

For continuous frequency sweeps, the synthesizer is set to a selected start frequency, the loop error voltage is held constant and the synthesizer is unlocked. Then, a continuous ramp voltage is applied to the tuning input of the YTO 20. The ramp voltage VSWP is generated by a sweep generator 40 which will be described in detail hereinafter. The fractional-N phase locked loop 24 can generate phase locked sweeps, typically over a narrow frequency range, without the application of a ramp signal.

The output of the YTO 20 is coupled through an amplifier 42 to a linear modulator 44. The output of linear modulator 44 is coupled through a pulse modulator 46 and an amplifier 48 to a microwave post processor 50. The microwave post processor 50 typically includes a YIG tuned multiplier which is utilized at the upper end of the frequency range to multiply the output frequency of YTO 20. The output of microwave post processor 50 is coupled through a coupler/detector 52 and an attenuator 54 to an RF output 56. The attenuator 54 provides selectable attenuation of the RF output The coupler/detector 52 includes a directional coupler and a detector 60. The output of detector 60 is connected to an automatic level control 62. Outputs of the automatic level control 60 are connected to linear modulator 44 and pulse modulator 46, thereby forming a closed-loop power level control. The automatic level control (ALC) 62 maintains the source output power at a level determined by an ALC level reference signal over the frequency sweep. The ALC 62 also is used for amplitude modulation and pulse modulation of the source output. As described hereinafter, the ALC level reference is supplied to the ALC 62 from sweep generator 40.

A frequency counter 66 is connected to the output of amplifier/filter 30. The frequency counter 66 is used in connection with the slope correction technique to be described hereinafter. The frequency counter 66 is controlled by an enable signal supplied by the sweep generator 40.

Figure 2B:
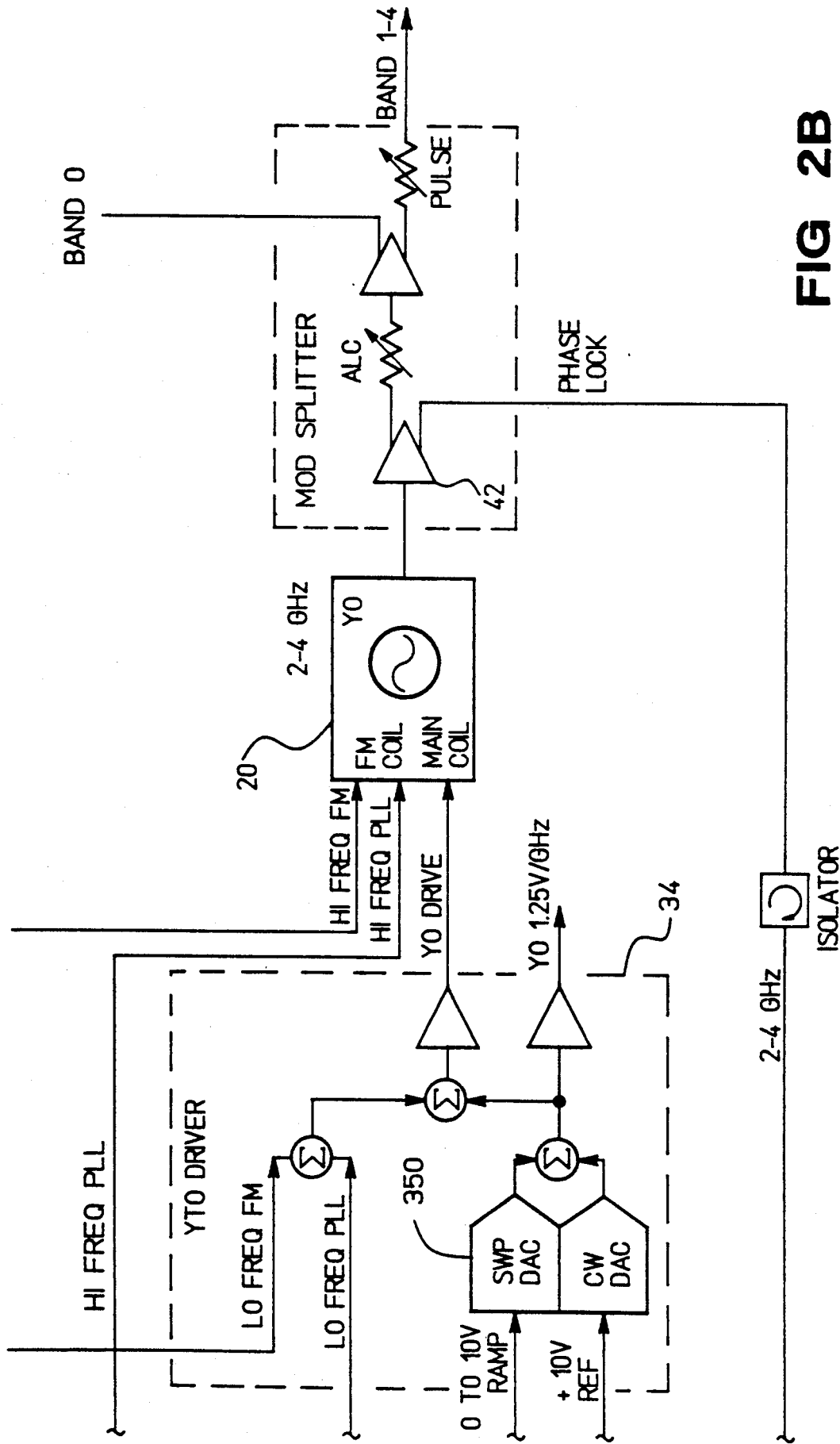

A reference generator 68 supplies a 1 megahertz clock signal to sweep generator 40. In addition, the reference generator 68 supplies a fractional-N reference to fractional-N phase locked loop 24 and a sampler reference to sampler phase locked loop 22. Typically, the fractional-N reference is 125 kilohertz, and the sampler reference is 40 megahertz. The fractional-N phase locked loop 24 receives a start signal FNGO from sweep generator 40 and supplies a signal FNSWP to sweep generator 40. The sweep generator 40 also supplies a TRIGGER OUTPUT signal, which is the basic digital signal for synchronizing internal and external events. A more detailed schematic block diagram of the frequency synthesis portion of the swept frequency signal source is shown in FIG. 2.

Figure 3:
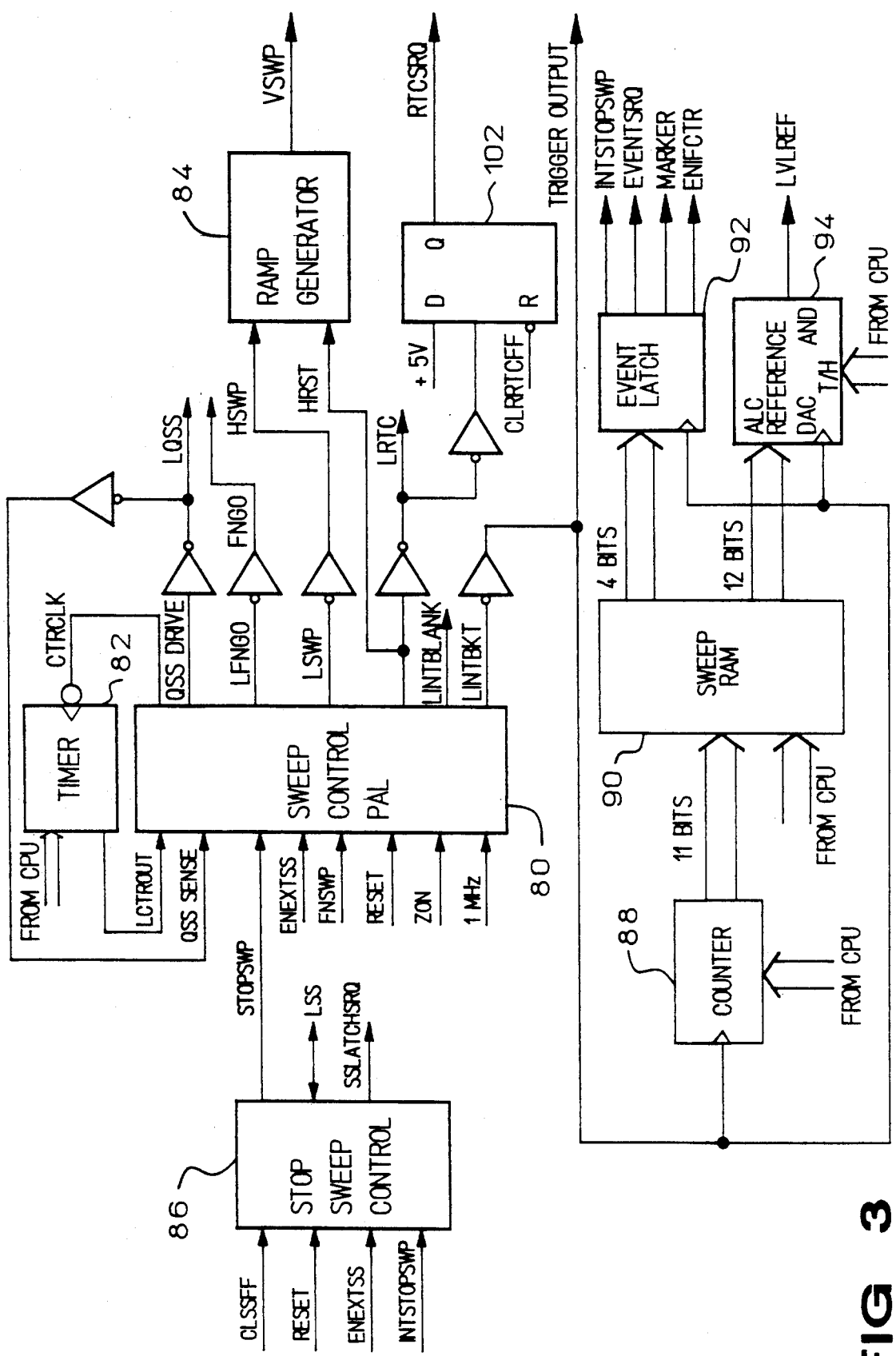
FIG. 3 is a schematic block diagram of the sweep generator of FIG. 1.

A schematic block diagram of the sweep generator 40 is shown in FIG. 3. The basic elements of the sweep generator 40 are a sweep control PAL (programmable array logic) 80, a timer 82, a ramp generator 84, a stop sweep control 86, a counter 88, sweep RAM 90, an event latch 92 and an ALC reference DAC and track-/hold 94. The basic function of the ramp generator 84 is to generate a continuous ramp signal VSWP for sweeping the frequency of the YTO 20. The ramp signal VSWP is typically a continuous ramp voltage between 0 volts and 10 volts in a time selected by the user.

Figure 3A:
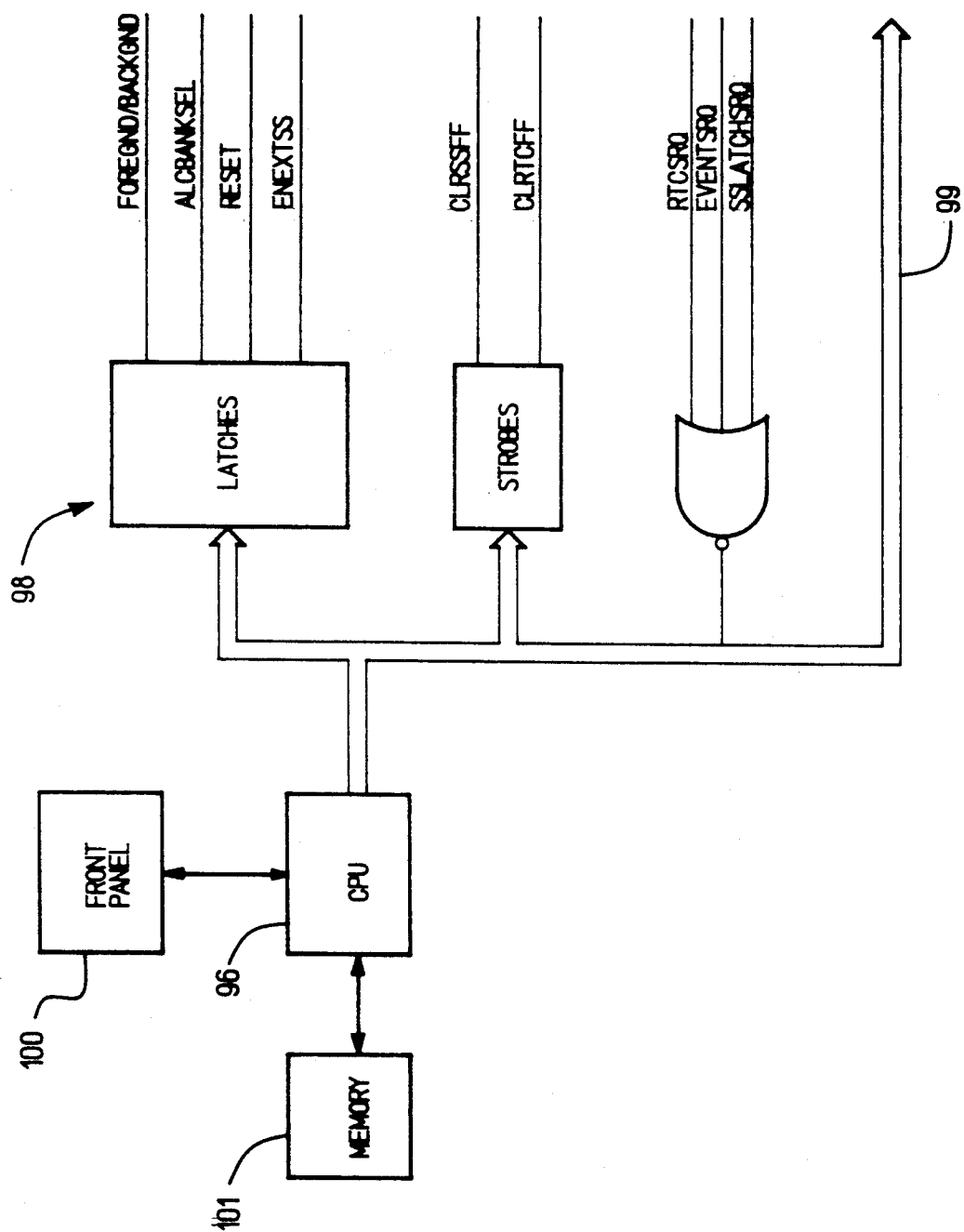
FIG. 3A is a block diagram showing the computer which controls the sweep synthesizer.

The operations of the swept synthesizer are controlled by a CPU 96, as shown in FIG. 3A. The CPU 96 communicates with the swept synthesizer circuitry through a CPU interface 98 which includes suitable latches, strobes and gating circuitry for control signals, and a bus 99 for transferring data to and from the CPU 96. A front panel 100, including operator selection switches and displays, is coupled to CPU 96. A memory 101 interconnected to the CPU 96 contains a control program for operating the swept synthesizer source. In a preferred embodiment, the CPU 96 is a Motorola 68000 and the memory 101 includes 256K×8 bits of RAM, 256K×16 bits of ROM and 32K×8 bits of EEROM.

The sweep generator 40 maintains synchronism between the continuous ramp voltage, a sequence of digital pulses on the TRIGGER OUTPUT line and the frequency of the swept RF output signal. These events are synchronized to the 1 megahertz clock that is generated in the reference generator 68. The phases and frequencies of all 1 megahertz clocks are maintained equal in systems with multiple sources by use of the 10 megahertz clock and the LDIVSYNCH signals as described hereinafter. The phase of the fractional-N reference supplied to the fractional-N phase locked loop 24 is also maintained in a known phase relationship to the 1 megahertz clock.

The sweep control PAL 80 provides control signals to the ramp generator 84 and the fractional-N phase locked loop 24. These control signals are maintained in synchronism with the TRIGGER OUTPUT signal. The control signals HSWP and HRST to the ramp generator 84 cause the ramp generator 84 to reset, pause and resume sweeping. The control signal FNGO sent to the fractional-N phase locked loop 24 causes that unit to begin the process of sweeping. Starting of the sweep takes a varying amount of time depending on the fractional-N frequency. The fractional-N phase locked loop 24 notifies the sweep control PAL 80 when it is ready to start sweeping by asserting the signal FNSWP.

The sweep control PAL 80 also handles the timing protocol of the LSS (low stop sweep) and LQSS (low qualified stop sweep) signals. The LQSS signal is updated by the sweep control PAL 80 on each clock edge based on the state of the STOPSWP signal received from the stop sweep control 86. These signals are described in more detail hereinafter.

The sweep control PAL 80 provides the functions of sweep control, QSS drive control and blanking control. The sweep control functions include:

1. The HRST signal forces the analog ramp voltage to be reset to 0 volts. The true-to false transition of this signal corresponds precisely with the LSWP signal, and the CTRCLK signal changes when a sweep begins.
2. The CTRCLK signal is the clock to the timer 82. This signal is counted by the timer 82 to determine when to cause the PAL 80 input signal LCTROUT to be set low, thereby setting up a TRIGGER OUTPUT pulse.
3. The LSWP signal coincides precisely with the times that the CTRCLK signal is active to ensure that the analog ramp voltage will only be changing during times that the TRIGGER OUTPUT generation is active.
4. The LINTBKT signal goes low for one microsecond to generate each TRIGGER OUTPUT pulse.
5. The FNGO signal notifies the fractional-N phase locked loop 24 to begin a sweep. The FNSWP signal input to PAL 80 immediately goes low (false). The fractional-N phase locked loop 24 acknowledges the sweep beginning by setting the FNSWP signal high again. The PAL 80 drives the FNGO signal when the stop sweep signals have gone away. The actual sweep signals LSWP, CTRCLK, and HRST wait until the FNSWP signal is supplied by the fractional-N phase locked loop 24 before changing.

To allow hidden sweeps for calibration, the ENEXTSS signal is examined by the PAL 80. This line masks the LSS signal from the ramp generator and is used by the PAL 80 to mask the QSS SENSE signal as well. When the ENEXTSS signal is low, the PAL 80 no longer waits for the QSS SENSE to start a sweep.

6. The QSS DRIVE signal is the qualified STOPSWP input signal. The PAL 80 implements a D flip-flop function on this line.
7. The LINTBLANK signal controls the Z axis blanking. The Z-axis is blanked at each stop sweep and while the sweep is reset. The Z axis can be forced on by the ZON input to PAL 80. While doing a practice sweep (ENEXTSS low), the LINTBLANK signal is forced low to blank any displays during the calibration.

The detailed logic function implemented by sweep control PAL 80 is set forth in Appendix A attached hereto.

The timer 82, a programmable timer, is controlled by the CTRCLK signal from the sweep control PAL 80.

The timer 82 determines the spacing between the TRIGGER OUTPUT pulses during a sweep and provides a LCTROUT signal to the sweep control PAL 80. The timer 82 setting is adjusted by the CPU 96 to establish the sweep time of the instrument.

The stop sweep control 86 monitors and controls the LSS signal. The LSS signal is asserted by the stop sweep control 86 whenever the RESET signal is high or if the INTSTOPSWP signal is asserted by the event latch 92. The stop sweep control 36 also contains a latch that is tripped by the assertion of the LSS signal. The latch reasserts LSS and alerts the CPU 96 so as to prevent any external device from stopping the sweep and then resuming sweeping before the CPU 96 has had time to respond.

The LRTC (low retrace) signal is used to provide a measure of synchronization of sources that would otherwise have no means of determining when the beginning of a sweep occurs. Whenever any source is retracing, the LRTC signal is asserted. This causes a flip-flop 102 to be set, thereby latching the event and alerting the CPU 96 via the RTCSRQ signal. The CPU 96 can then abort any sweep in progress and start over in again in synchronism with the rest of the system.

The TRIGGER OUTPUT pulses are the basic digital synchronization pulses for triggering both internal and external operations in synchronism with the ramp voltage and the swept frequency RF output. Preferably, a fixed number of TRIGGER OUTPUT pulses is generated regardless of the sweep time. The pulse width and the number of pulses generated during a sweep can be arbitrarily selected. In a preferred embodiment, the TRIGGER OUTPUT pulses have a width of 1 microsecond, and 1601 pulses are generated during a sweep. Since the number of pulses is fixed and the sweep time is selectable, the time between TRIGGER OUTPUT pulses varies with sweep time.

As TRIGGER OUTPUT pulses are generated, they are sent to the external system to trigger data taking by receivers. The TRIGGER OUTPUT pulses are also used internally by the signal source to index and control a number of sweep related events Each TRIGGER OUTPUT pulse increments the counter 88. The counter 88 provides an 11 bit address to the sweep RAM 90. As the counter 88 is incremented, different locations in sweep RAM 90 are addressed. The data in each location of sweep RAM 90 contains the ALC level reference for that sweep position and sweep control information such as markers, stop sweep commands and any other desired information which must be synchronized to the sweep. In a preferred embodiment, the sweep RAM 90 includes 8K locations of 16 bits per location.

Each TRIGGER OUTPUT pulse clocks the data from sweep RAM 90 into the event latch 92 and into the ALC reference DAC and track/hold 94. The event latch 92 contains the following information:

1. The INTSTOPSWP signal is set to one to stop the sweep at a particular sweep position.
2. The EVENTSRQ signal is set to one to alert the CPU 96 at a particular sweep position.
3. The MARKER signal is set to one to control an identifying marker on the sweep output at a particular sweep position.
4. The ENIFCTR signal is set to one to enable the frequency counter 66 (FIG. 1).

The INTSTOPSWP signal is sent to the stop sweep control 86 and causes the LSS and STOPSWP signals to be asserted. The event for a band change is typically to set the INTSTOPSWP bit and the EVENTSRQ bit in the sweep RAM 90 at the location where the band change is to occur. The sweep is then stopped after that TRIGGER OUTPUT pulse is generated, and the CPU 96 is alerted with a service request.

Figure 3B:
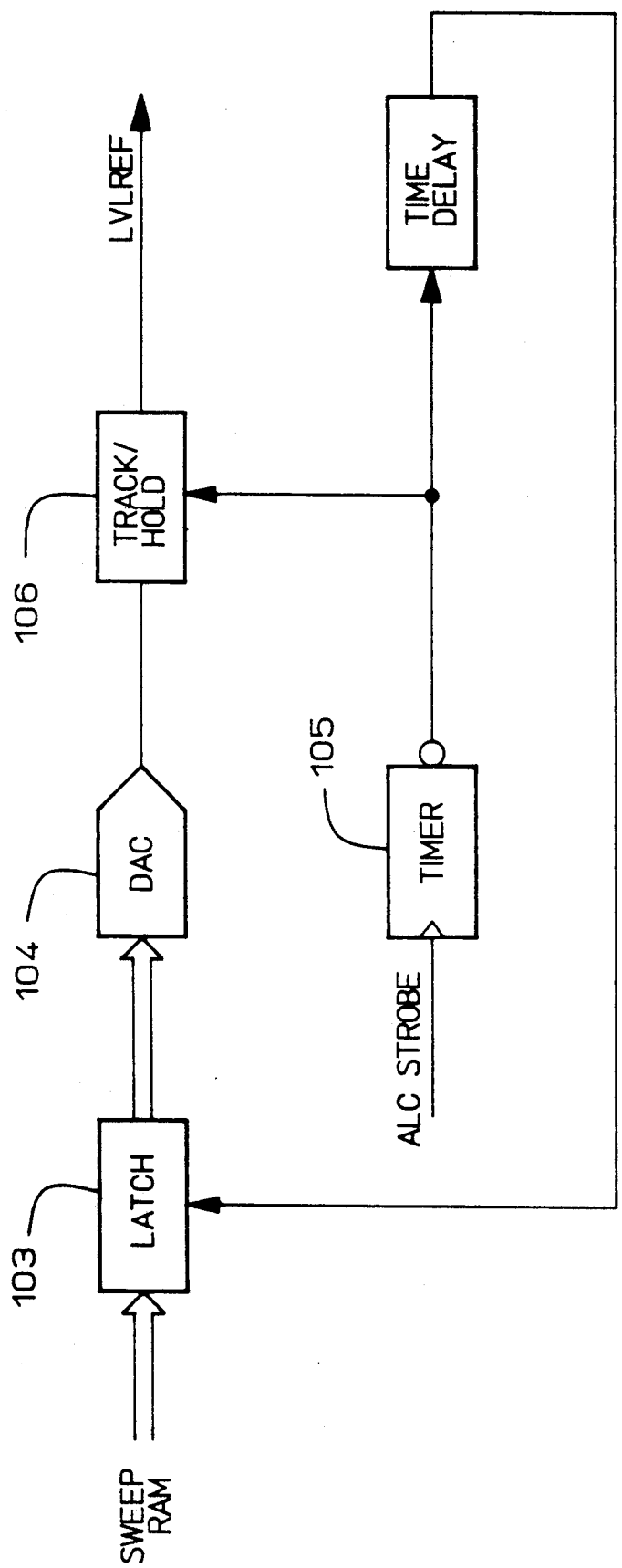
FIG. 3B is a block diagram of circuitry associated with automatic level correction.

The ALC reference DAC and track/hold 94, as shown in FIG. 3B, receives the sweep RAM 90 ALC data in a latch 103 and forwards it to a DAC 104 on each TRIGGER OUTPUT pulse. A timer 105 controls the state of a track/hold circuit 106 so that the actual ALC level reference changes between TRIGGER OUTPUT pulses. This prevents the ALC level from being changed at the same time as data is being acquired. This arrangement also serves as a "de-glitcher" for the DAC 104, thereby removing large transient outputs that occur as the DAC 104 is changed over certain values.

Figure 4:
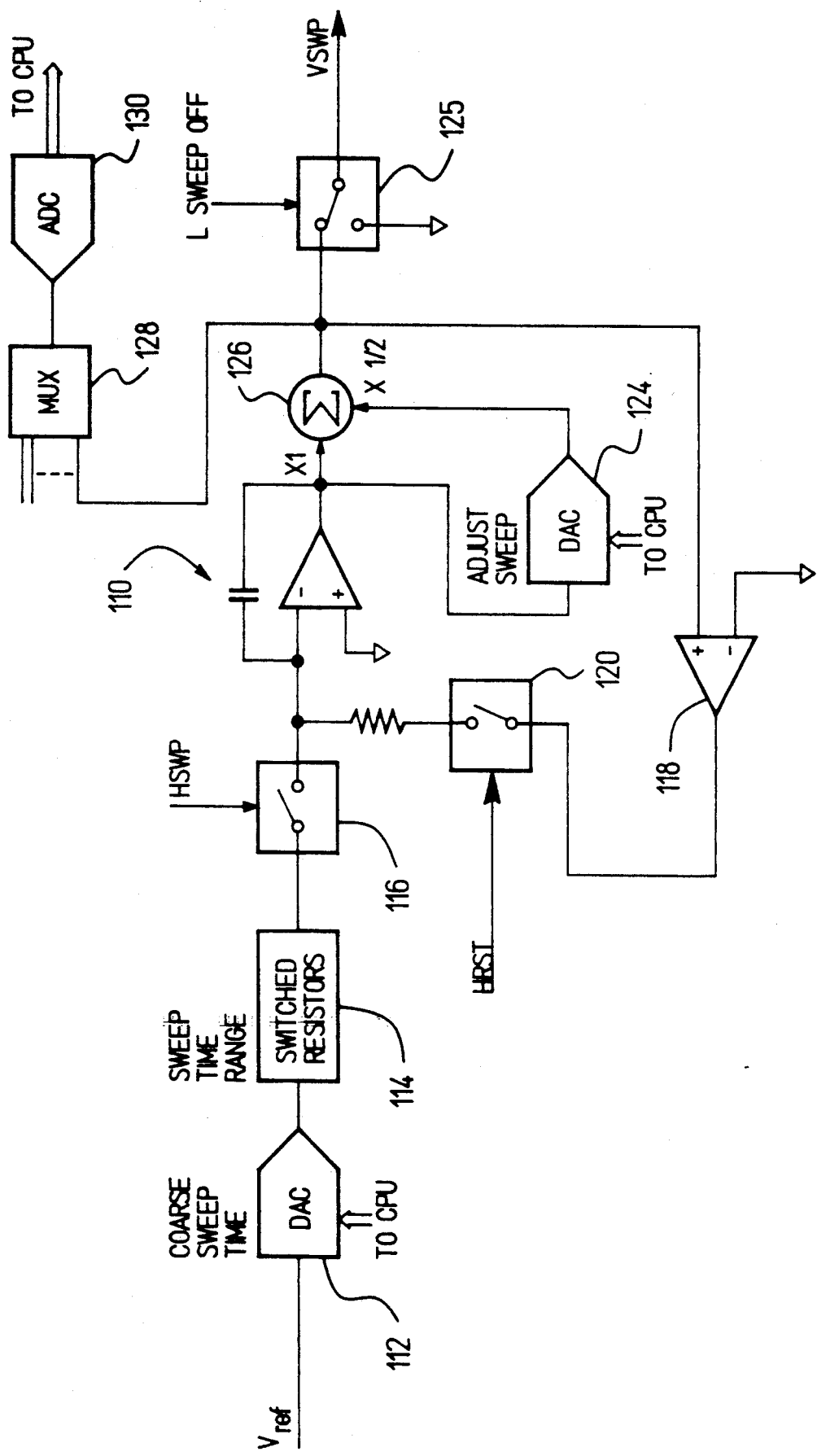
FIG. 4 is a schematic block diagram of the ramp generator of FIG. 3.

A block diagram of the ramp generator 84 is shown in FIG. 4. A continuous ramp voltage is generated by controlling the current into an integrator 110. The integrator current is set by a combination of a voltage output digital-to-analog converter (DAC) 112 and a bank of switched resistors 114 for range selection. The sweep ramp is stopped by opening a switch 116 which interrupts the current into the integrator 110. The state of switch 116 is controlled by the HSWP signal from the sweep control PAL 80. The ramp voltage is reset to 0 volts prior to starting the sweep by switching a reset amplifier 118 into a feedback path around integrator 110. The feedback path is closed by a switch 120 that is controlled by the HRST signal from sweep control PAL 80. The reset amplifier 118 senses the ramp voltage and adjusts the input current to integrator 110 until the ramp voltage is 0 volts. To start the sweep, the reset amplifier 118 is switched out of the feedback path of the integrator 110, and the current from the switched resistors 114 and DAC 112 is switched on.

Figure 4A:
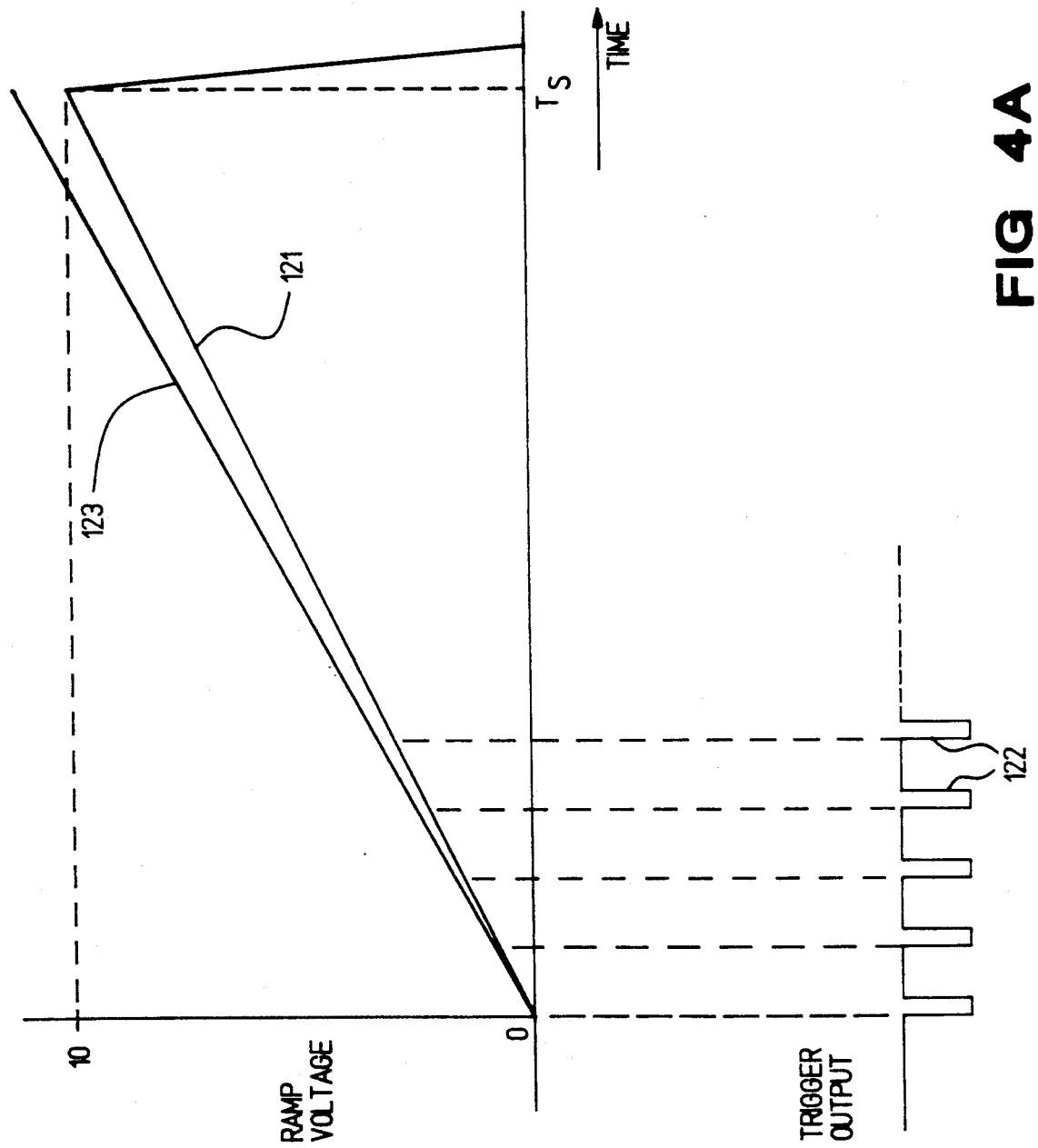
FIG. 4A is a timing diagram illustrating synchronization of the ramp voltage the digital synchronization pulses.

In order to generate an accurate ramp voltage that is synchronous with the digital TRIGGER OUTPUT pulses, the voltage slope of the ramp generator output must be set such that a desired end of sweep ramp voltage is reached at the precise time that the digital TRIGGER OUTPUT signal indicates end of sweep. As shown in FIG. 4A, an accurate ramp voltage 121 can be precisely synchronized to TRIGGER OUTPUT pulses 122 so that each TRIGGER OUTPUT pulse corresponds to a predetermined point on ramp voltage 121 and hence a predetermined frequency at the YTO 20 output. However, when a ramp voltage 123 that differs from the accurate ramp voltage 121 is generated, the predetermined frequencies do not correspond to the TRIGGER OUTPUT pulses, and synchronism is lost. While only a few TRIGGER OUTPUT PULSES are shown in FIG. 4A for clarity of illustration, it will be understood that 1601 equally-spaced TRIGGER OUTPUT pulses are generated during a full sweep.

The ramp generator 84 uses a DAC 124 to provide an adjustable gain stage after the integrator 110. The DAC 124 provides a means of adjusting the slope of the ramp voltage with very fine resolution. Since it is connected to the output of the integrator 110, the DAC 124 provides means to adjust the end of sweep voltage after the end of sweep occurs in contrast to the slope adjustment provided by adjusting the DAC 112 and the switched resistors 114.

Figure 5:
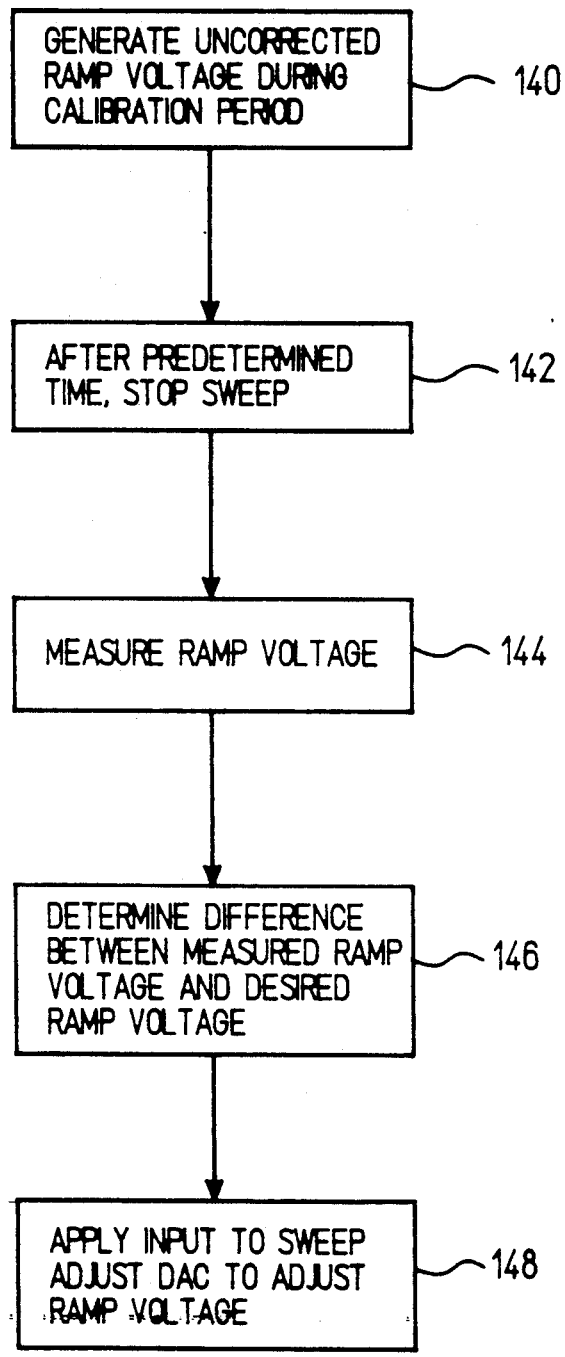
FIG. 5 is a flow diagram illustrating ramp correction in accordance with the present invention.

The ramp voltage is corrected during a practice or calibration sweep in which the ramp voltage is disconnected from the YTO 20 by a switch 125. A flow diagram of the ramp voltage correction procedure is shown in FIG. 5. The DAC 112 and switched resistors 114 are set to provide the selected sweep time, and ramp voltage is generated by integrator 110 in step 140, the output of integrator 110 is connected to a summing amplifier 126. The output of summing amplifier 126 provides the VSWP ramp voltage when switch 125 is closed. The ramp voltage is also connected through an analog multiplexer 128 and an analog-to-digital converter (ADC) 130 to the CPU 96 The ADC 130 converts the ramp voltage to a digital word representative of the ramp voltage magnitude.

At a predetermined time during the practice sweep, the sweep is stopped in step 142, and the CPU 96 measures the ramp voltage in step 144. For short sweeps, the ramp voltage is measured at the end of the sweep. In this case, the ramp voltage should be 10 volts. The ramp generator is designed to generate a ramp voltage that sweeps between 0 and 10 volts regardless of the selected sweep time. If the CPU 96 determines that the measured ramp voltage differs from the desired ramp voltage at the predetermined measurement time in step 146, a gain adjustment is applied to the DAC 124 in step 148. The input to DAC 124 is the output of integrator 110, and the output of DAC 124 is connected to summing amplifier 126. In a preferred embodiment, the summing amplifier 126 provides unity gain for the output of integrator 110 and a gain of one half for the output of DAC 124.

The digital word applied to DAC 124 by CPU 96 is such that the ramp voltage at the output of summing amplifier 126 equals the desired value at the measurement time. Thus, for example, if the uncorrected ramp voltage at the output cf amplifier 126 is 10.2 volts at the end of sweep, the DAC 124 setting is reduced sufficiently to correct the output of amplifier 126 to exactly 10 volts. Since the input to DAC 124 is the continuous ramp voltage, the appropriate correction value is applied throughout the sweep. After the practice or calibration sweep, the DAC 124 maintains the necessary correction, and the output of amplifier 126 is a precision sweep between 0 volts and 10 volts. It will be understood that different sweep voltage ranges can be utilized within the scope of the present invention.

When the sweep time is changed, new settings of the DAC 112 and the switched resistors 114 are selected. In order to provide an accurate ramp voltage for the new combination, the ramp voltage correction procedure described above is repeated.

As indicated above, the practice sweep can be allowed to continue for a full sweep. In the case of long sweep times, calibration time is limited by reducing the practice sweep to a fraction of the full sweep. In a preferred embodiment, the maximum time spent in a practice sweep is 400 milliseconds or 10 percent of the sweep time, whichever is greater. When 10 percent of the sweep time is used for calibration, the desired ramp voltage after 10 percent of a full sweep is 1 volt. The comparison and correction is performed in the same manner described above for a full sweep.

Figure 6:
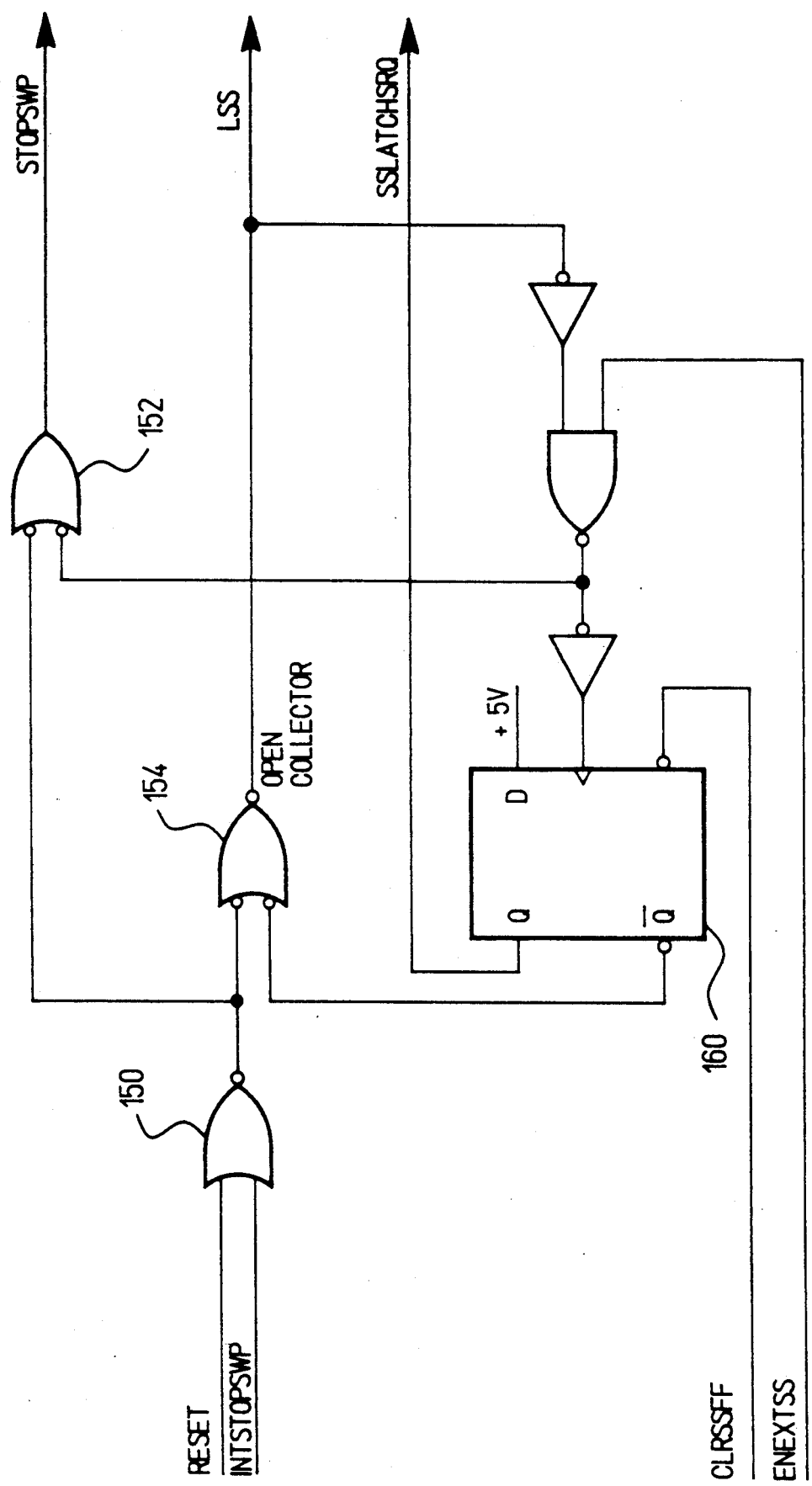
FIG. 6 is a schematic diagram of the stop sweep control of FIG. 3.

The stop sweep control 86 is shown in FIG. 6. The function of the stop sweep control 86 is to generate the STOPSWP signal supplied to the sweep control PAL 80 and to control the LSS (low stop sweep) signal. The STOPSWP signal and the LSS signal are initiated by the RESET signal from the CPU 96 or the INTSTOPSWP signal from event latch 92. The RESET and INTSTOPSWP signals are coupled through a logic gate 150 to a gate 152 which controls the STOPSWP signal and to a gate 154 which controls the LSS signal. A flip-flop 160 is used to latch any LSS signal assertions and to reassert the LSS signal to prevent the sweeps of other sources from continuing until the CPU 96 has had time to intervene. The flip-flop 160 also causes the SSLATCHSRQ signal to go high, which alerts the CPU 96 of a latched stop sweep condition. The ENEXETSS signal is set by the CPU 96 to disable any external devices from being able to affect the STOPSWP signal by the use of the LSS line. This is necessary in order to perform a practice sweep as described above.

Figure 7:
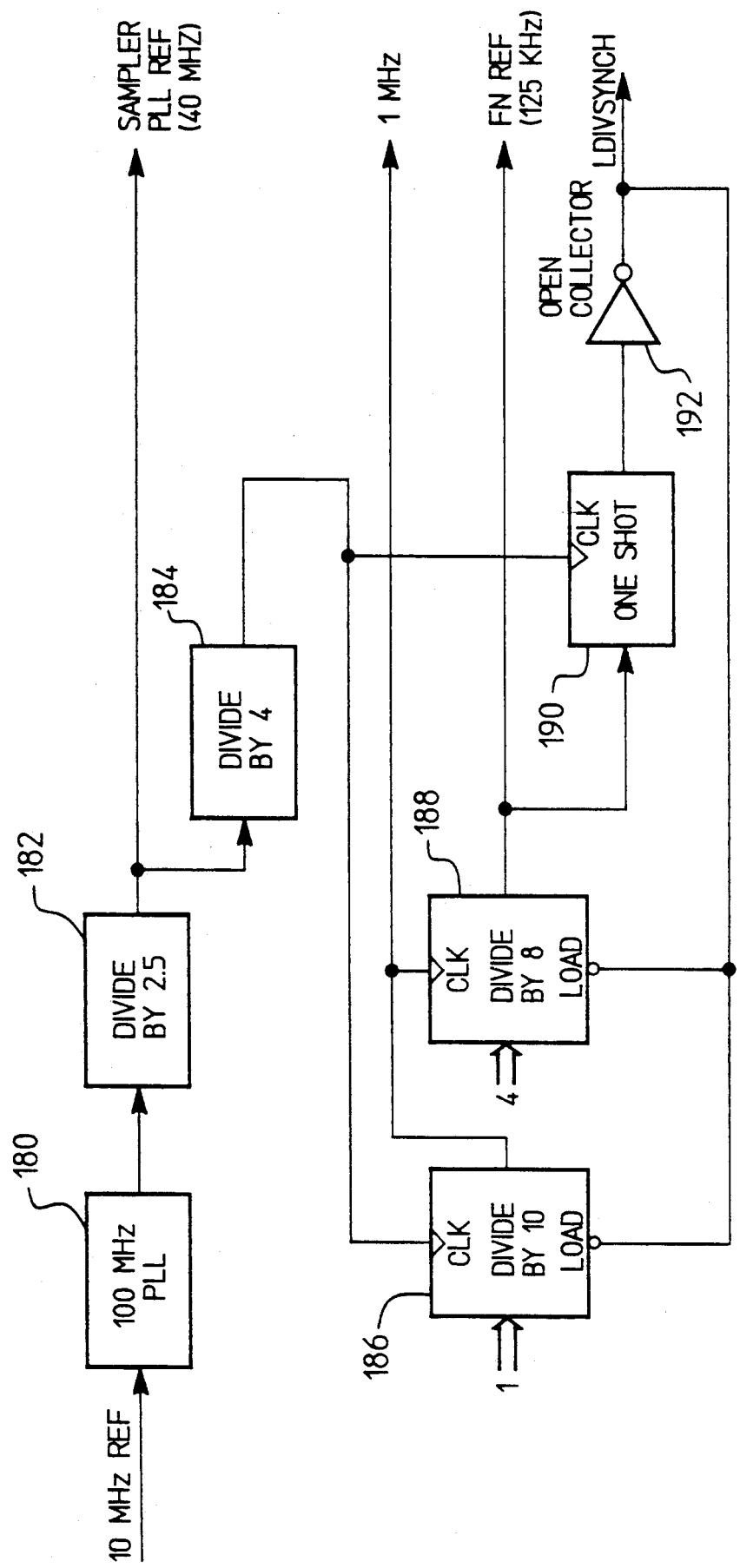
FIG. 7 is a schematic block diagram of the reference generator of FIG. 1.

A simplified block diagram of the reference generator 68 is shown in FIG. 7. A 100 megahertz phase locked loop 180 is locked to a 10 megahertz input reference signal which is generated by a highly accurate crystal oscillator. The 100 megahertz output of phase locked loop 180 is divided by 2.5 in frequency divider 182 to provide a 40 megahertz reference frequency for the sampler phase locked loop 22. The 40 megahertz reference is divided by 4 in frequency divider 184 to provide a 10 megahertz internal reference signal. The 10 megahertz internal reference signal is divided by 10 in frequency divider 186 to provide a 1 megahertz clock used by the sweep generator 40. The 1 megahertz clock is divided by 8 in frequency divider 188 to provide a 125 kilohertz reference signal for fractional-N phase locked loop 24.

In order to ensure that multiple signal sources step or sweep together, the 1 megahertz and 125 kilohertz reference signals in each instrument must be phase locked by connecting the 10 megahertz references together. Phase synchronizing is achieved by connecting a bi-directional wired-OR LDIVSYNCH line between all of the sources to be phase locked. This line is activated in each source when the most significant bit of the divide-by 8 counter 188 makes a zero-to-one transition. A digital one shot 190 connected to the most significant bit of the divider 188 (the 125 kilohertz reference signal) ensures that the LDIVSYNCH pulse lasts for only one cycle of the 1 megahertz clock. The output of one shot 190 is coupled through an open collector buffer 192 to the LDIVSYNCH line.

The bi-directional LDIVSYNCH line causes the divide-by-10 counter 186 and the divide-by-8 counter 188 in all of the sources, including those in the source which pulled the line low, to be set to a common state. The counters, when synchronized, must be set to the next state after the state which caused the LDIVSYNCH pulse to be generated. Otherwise, the count would be discontinuous. Since the LDIVSYNCH pulse is generated when counter 188 equals 4 and counter 186 equals 0, the counters are loaded at the start of the next clock pulse such that counter 188 equals 4 and counter 186 equals 1. Thus, the counters proceed to the next state in the count sequence without interruption, and synchronization is achieved in all connected sources.

Figure 8:
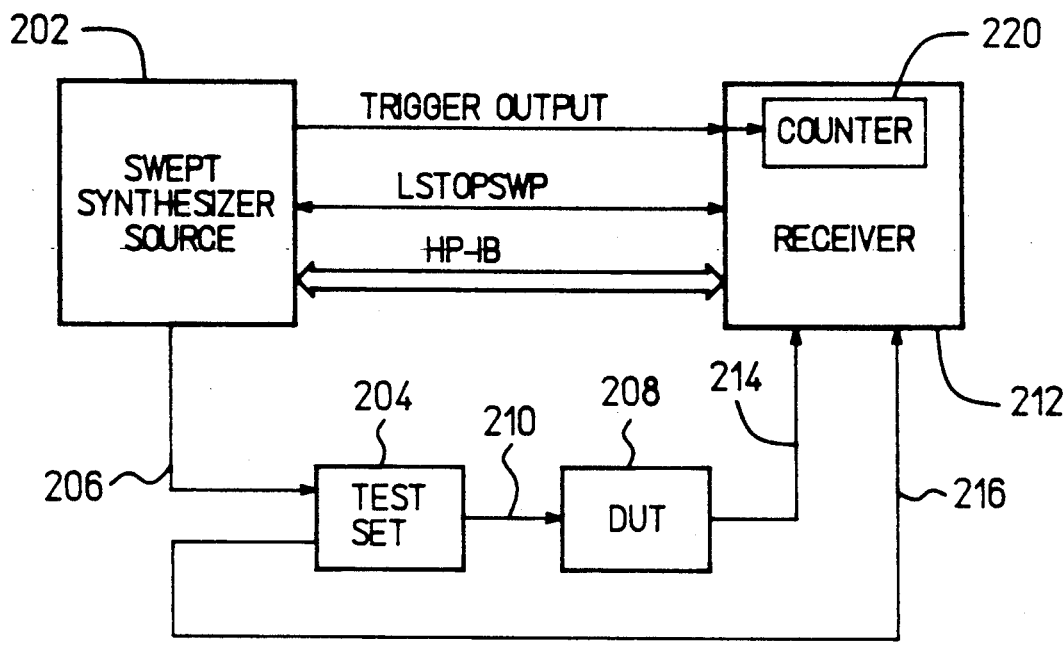
FIG. 8 is a simplified block diagram of a network analyzer system showing the interconnections between the source and receiver for digital synchronization.

A simplified block diagram of a network analyzer system which incorporates the swept synthesizer source of the present invention is shown in FIG. 8. Swept synthesizer source 202 provides a swept frequency RF signal to a test set 204 on a line 206. The test set 204 contains one or more directional couplers for separating incident and reflected signals for measurement. Test set configurations are well known in the art. An RF output of test set 204 is supplied to a device under test (DUT) 208 on a line 210. The RF output of the DUT 208 is connected to a receiver 212 on a line 214. A portion of the RF input signal is coupled from test set 204 to receiver 212 on a line 216. The configuration shown in FIG. 8 provides forward transmission measurements of the DUT 208 Other configurations for measuring forward and reverse reflection coefficients and reverse transmission coefficients are known to those skilled in the art. The receiver 212 can be similar to a Model 8510 manufactured and sold by Hewlett Packard Company.

In accordance with the present invention, the TRIGGER OUTPUT signal carrying the digital synchronizing pulses is coupled from source 202 to receiver 212. The digital synchronizing pulses are accumulated in a counter 220. Since the ramp voltage which sweeps the source output is precisely synchronized to the TRIGGER OUTPUT pulses, the state of counter 220 provides a precise indication of the progress of a sweep. The receiver 212 can thereby synchronize events such as data taking and markers to predetermined points in the sweep as determined from the digital synchronization pulses. As discussed previously, each sweep is associated with 1601 digital synchronization pulses on the TRIGGER OUTPUT line. The receiver 220 can include a RAM (not shown) similar to the sweep RAM 90 for storing information concerning events at various points in the sweep. The LSTOPSWP signal is also coupled from the source 202 to receiver 212 to provide a stop sweep indication to receiver 220. Additional information such as frequency limits, power levels and sweep times are coupled between source 202 and receiver 212 on an HP IB instrument bus. Further information regarding the HP IB instrument bus interconnection is provided in the aforementioned U.S. Pat. No. 4,641,086 The digital synchronization scheme shown and described herein provides more accurate synchronization between source 202 and receiver 212 than was possible in the prior art configuration wherein the receiver used an analog-to-digital converter to convert the ramp voltage to a digital pulse train.

Figure 9:
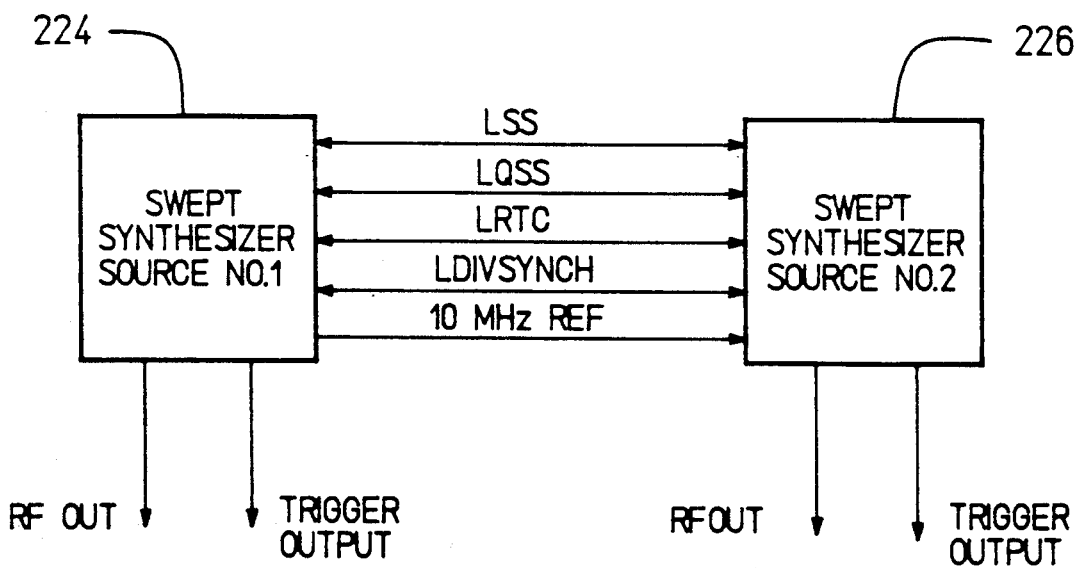
FIG. 9 is a simplified block diagram illustrating the interconnection of two sources in accordance with the present invention.

A block diagram of a multiple source configuration is shown in FIG. 9. A swept synthesizer source 224 is interconnected with a swept synthesizer source 226 to provide synchronized sweeps. The LSS, LQSS and LRTC signals provide synchronization as described hereinafter. The 10 megahertz reference from one of the synthesizers is connected to the other, and the LDIVSYNCH signal ensures phase locking as described hereinabove. Additional sources can be connected in a similar fashion. The LSS and LQSS lines are open collector lines that are connected to all sources. The LDIVSYNCH signal is generated by the source that is using an internal 10 megahertz reference and is received by those sources that are using an external 10 megahertz reference.

As indicated previously, the sweep generator 40 provides a predetermined number (preferably 1601) of TRIGGER OUTPUT pulses during a sweep. The TRIGGER OUTPUT pulses notify the receiver to take data and are used internally by the source as described above. The TRIGGER OUTPUT pulse is generated at the point in time that the RF output of the source is stable and ready to be used for measurement. In stepped sweep modes, programmable pre-trigger and post-trigger delays enable maximum flexibility in the use of TRIGGER OUTPUT pulses in a measurement system. The delays enable positioning of the trigger pulse with respect to the settling of the source and the settling of the receiver. The receiver can subdivide the TRIG- GER OUTPUT pulses to produce displays with coarser resolution than 1601 points, if desired.

Figure 10:
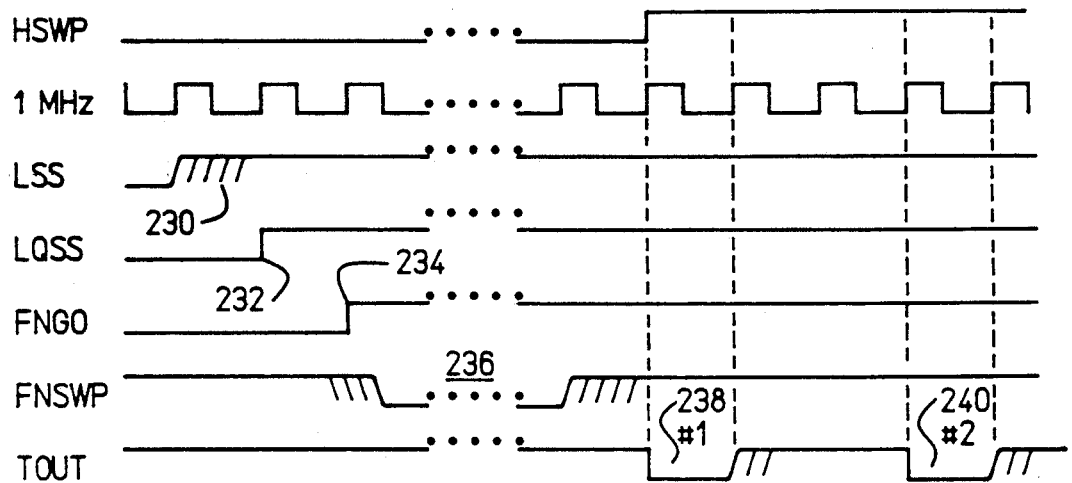
FIG. 10 is a timing diagram illustrating the start of a linear sweep.
Figure 11:
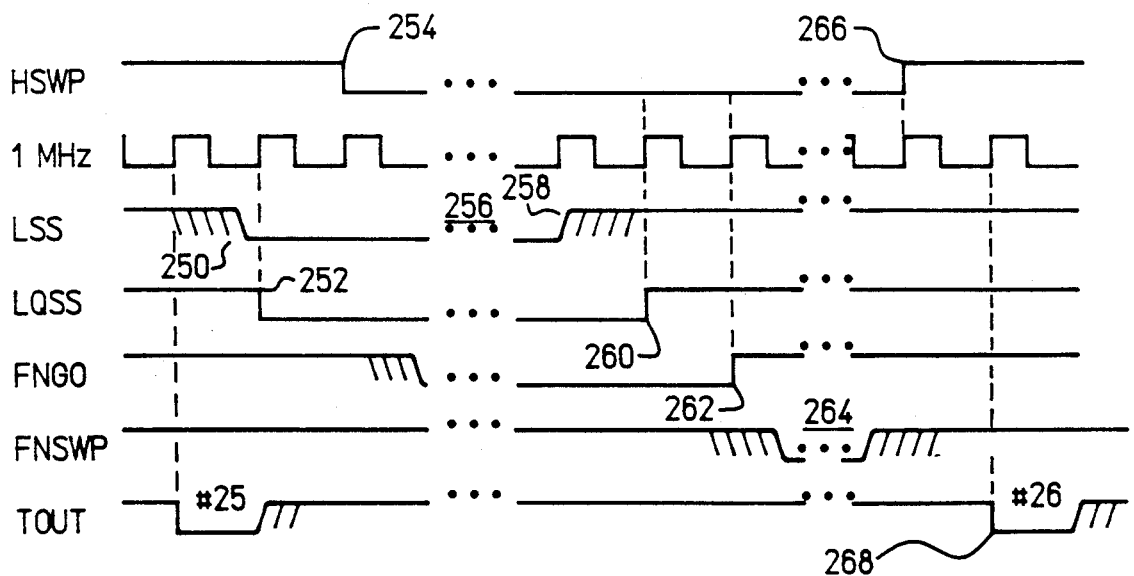
FIG. 11 is a timing diagram illustrating a stop sweep in the case of a linear sweep.

Timing diagrams for signals associated with linear nonstepped sweeps are shown in FIGS. 10 and 11. The following is a definition of the signals shown.

1. TOUT (TRIGGER OUTPUT) is an external TTL signal generated by the source to notify the receiver that data should be taken at this instant in time. In a preferred embodiment, the TRIGGER OUTPUT includes 1601 pulses per sweep, each pulse having a 1 microsecond width. The leading edge of the pulse is used for timing.

2. One megahertz clock is an internal synchronizing reference signal. It is used by all interconnected sources. The one megahertz clocks are equal in phase and equal in frequency by way of the 10 megahertz references that are connected together as shown in FIG. 9 and the frequency divider synchronizing signal LDIVSYNCH.

3. The LSS (low stop sweep) signal is an external open collector TTL line that is asserted when the sweep is to be stopped. Typically, this signal is asserted by the receiver when band crossings are required. This signal can be asserted at any time by the system.

4. The LQSS (low qualified stop sweep) signal is an external open collector TTL line that is used to interconnect sources in a multiple source configuration. The signal is used by sources that have the TRIGGER OUTPUT synchronization capability. The purpose of the signal is to remove the ±1 microsecond ambiguity in synchronizing a sweep with multiple sources. The ambiguity arises from the use an asynchronous LSS signal. If the LSS signal changes state within the setup time of the synchronous sweep generators, then it is possible for one of the sources to recognize the LSS transition and another source to miss the transition until the subsequent 1 megahertz clock edge, resulting in a 1 microsecond error in sweeps. By using the LQSS signal to determine when to begin sweeping, there is no possibility of losing synchronous operation. The LQSS signal is driven by all devices based on examination of the LSS signal. At each 1 megahertz clock edge, the LQSS signal is updated by each source to reflect the status of the LSS signal.

5. The LRTC (low retrace) signal is an external open collector TTL line that is asserted when a device is resetting its sweep. This signal provides a means of alerting other sources to the reset and causes them to reset, thereby causing all of the sources to become synchronized at the beginning of the sweep.

6. The HSWP (high sweep) signal is an informational signal that indicates when the sweep is in progress. When HSWP signal is high, the ramp voltage is increasing, and the output frequency is changing.

7. The FNGO (fractional-N go) signal is an internal signal line that is sent to the fractional-N phase locked loop to initiate the process of starting the sweep.

8. The FNSWP (fractional-N sweep) signal is an internal signal from the fractional-N phase locked loop 24 which indicates that the fractional-N phase locked loop will start sweeping at the next 1 megahertz clock edge.

9. Ten megahertz reference is the frequency reference for all synthesis loops in the swept synthesizer. One source supplies its reference to the other.

10. The LDIVSYNCH (low divider synchronize) signal is an external open collector TTL signal that is pulsed by any source to cause the 1 megahertz clock generators to phase synchronize.

The signals associated with the start of a nonstepped continuous sweep are shown in FIG. 10. It is assumed that there are two or more swept synthesizer sources that are being synchronized with the LQSS and LSS signals. Various times in the timing diagram are identified by reference numerals.

Assume that all sources in the system are ready to start sweeping. The LSS line goes high at time 230 when the last device releases it. This transition can occur at any time relative to the 1 megahertz clock, since there can be devices in the system that are not synchronized to the 1 megahertz clock. After LSS has gone high, the sources release LQSS at the next 1 megahertz clock edge at time 232. If the LSS transition occurs very close to a 1 megahertz edge, it is possible that not all sources will recognize the transition at the same time. A problem is not created, since the LQSS line remains asserted until all the sources have recognized the change in state of LSS. This arrangement eliminates the ±1 microsecond timing ambiguity that the LSS transition could cause.

The sources then assert the FNGO signal at time 234, signalling the fractional-N phase locked loops to begin their sweeps. This is done even if the fractional-N phase locked loop is not being swept in order to provide a consistent delay to match the timing of a source in the system that is performing a fractional-N sweep. All of the sources wait until the FNSWP lines are asserted high at time 232 by the respective fractional-N phase locked loops. The wait time is maintained the same and is typically 24-32 microseconds. After the FNSWP signal has been asserted by the fractional-N phase locked loops, the sources generate a TOUT pulse at the subsequent 1 megahertz clock signal, and the sweeps begin at the same time. The leading edge of the TOUT pulse indicates that the receiver should take data at the beginning of the sweep for the first data point. In a complete sweep, 1601 equally-spaced TOUT pulses are generated.

A timing diagram for a stop sweep in a nonstepped continuous sweep is shown in FIG. 11. It is assumed that two or more swept synthesizer sources are interconnected as shown in FIG. 9. A device in the system determines that it is necessary to stop the sweep (for example, for a band change). The LSS signal is asserted at time 250 by that device. Although LSS can be asserted at any time relative to the 1 megahertz clock, it is typically asserted immediately after a TOUT pulse has occurred. In this example, TRIGGER OUTPUT pulse no. 25 has been sent just before the LSS signal was asserted.

At the next 1 megahertz clock edge, the LQSS signal is asserted at time 252 by any sources in the system that recognize the LSS state change. If LSS transitioned near the edge of a 1 megahertz clock, it is possible that some devices in the system will not detect the transition at this time. The other devices will respond at the next 1 megahertz clock. One microsecond after the LQSS signal is asserted by any or all of the sources, the sweep stops at time 254. Any portion of the sweep that occurred since the last TOUT pulse is taken into consideration in determining the next TOUT pulse so that no portion of the sweep is lost or gained by stopping the sweep. In the example of FIG. 11, the sweep continued for 2 microseconds after the 25th TOUT pulse.

All of the devices wait for the LSS line to be released during time 256. The device that requested the LSS is performing a band change. Other devices are idle. To stop the sweep, the fractional-N phase locked loops are reprogrammed to reflect the current sweep position. This clears the FNGO line and prepares the fractional-N phase locked loops for resuming sweep. As devices become ready to continue, they release the LSS line. Finally, the last device to become ready releases the LSS line at time 258. At the next 1 megahertz clock edge after LSS is no longer asserted, the LQSS line goes high at time 260. If LSS transition is near the edge of a 1 megahertz clock, some devices in the system may not release LQSS until the next 1 megahertz clock edge.

The sources then assert the FNGO signal at time 262, thereby enabling the fractional-N phase locked loops to begin starting their sweeps. This is done even if the fractional-N phase locked loop is not being swept in order to provide a consistent delay to match the timing of the source that is doing a fractional-N sweep. All the sources wait during time 264 until the FNSWP lines are asserted high by the respective fractional-N phase locked loops. After the FNSWP line has been asserted, the sources resume sweeping at the next 1 megahertz clock edge at time 266. In this example, the TOUT pulses occur every 3 microseconds when the sweep is progressing. The timing and generation of TOUT pulses resumes as it had left off before the sweep was stopped after the correct spacing between TOUT pulses (2 microseconds in this example). The next TOUT pulse is generated at time 268. One microsecond delay occurred at time 252 before the sweep was stopped. One microsecond delay after the sweep resumes produces the proper spacing between TOUT pulses.

The swept synthesizer source described herein can sweep in a stepped sweep between a start and stop frequency and/or power with a programmable integer number of steps. It is desirable to allow multiple sources to step together with varying offsets in frequency between them. The TRIGGER OUTPUT pulses are used to drive receivers in the step mode, since the source synchronizes the TRIGGER OUTPUT pulses in stepped sweeps.

A typical usage of stepped sweeps is to perform mixer testing where it is necessary to have two sources provide signals to a mixer under test. The signals have a fixed frequency offset between them such that the mixer output remains constant in frequency, while the inputs to the mixer are stepped across the frequency range of interest. Since the two sources step to different frequencies, the settling times between steps will vary and will not, in general, be the same for the two sources. The stepped sweep synchronization described herein enables the two sources to be synchronized with any frequency steps selected, and a TRIGGER OUTPUT pulse provided to indicate when the mixer output is settled.

A TRIGGER OUTPUT delay allows the user to indicate the amount to time that the TRIGGER OUTPUT should be delayed after the sources have settled. In the example of mixer testing, if it is necessary for the receiver to have the IF present for 10 milliseconds before the TRIGGER OUTPUT pulse causes acquisition of data, then the TRIGGER OUTPUT delay is set for 10 milliseconds. The IF output of the mixer is guaranteed to be present for the amount of time specified by the TRIGGER OUTPUT delay. The settling of the multiple sources is accomplished in parallel to minimize the total switching time between points. The LSS and LQSS lines provide the means for multiple sources to individually inhibit the generation of TRIGGER OUTPUT pulses in all the sources until every source has had sufficient time to settle and the TRIGGER OUTPUT delay expires. Only then will the LSS line be released and allow the TRIGGER OUTPUT pulses to occur.

The following additional signals are relevant to stepped sweep synchronization.

1. The LSRCSTL (low source settled) signal is an external TTL signal that is set high when the source becomes unsettled at the beginning of a change in frequency and/or power and goes low once the new frequency and/or power has stabilized or settled.
2. The LSS signal is an informational signal to illustrate what the two sources are doing. If either of these is asserted, then the LSS line will be low.
3. The EXT TRIG signal is an external TTL input that is used to provide a hardware means of initiating a step.
4. TRIGGER 1 is a signal that initiates the step to the next frequency or power. The signal may be an external TTL signal connected to the rear panel of the source or the receipt of a signal over the HP IB interface bus.

Figure 12:
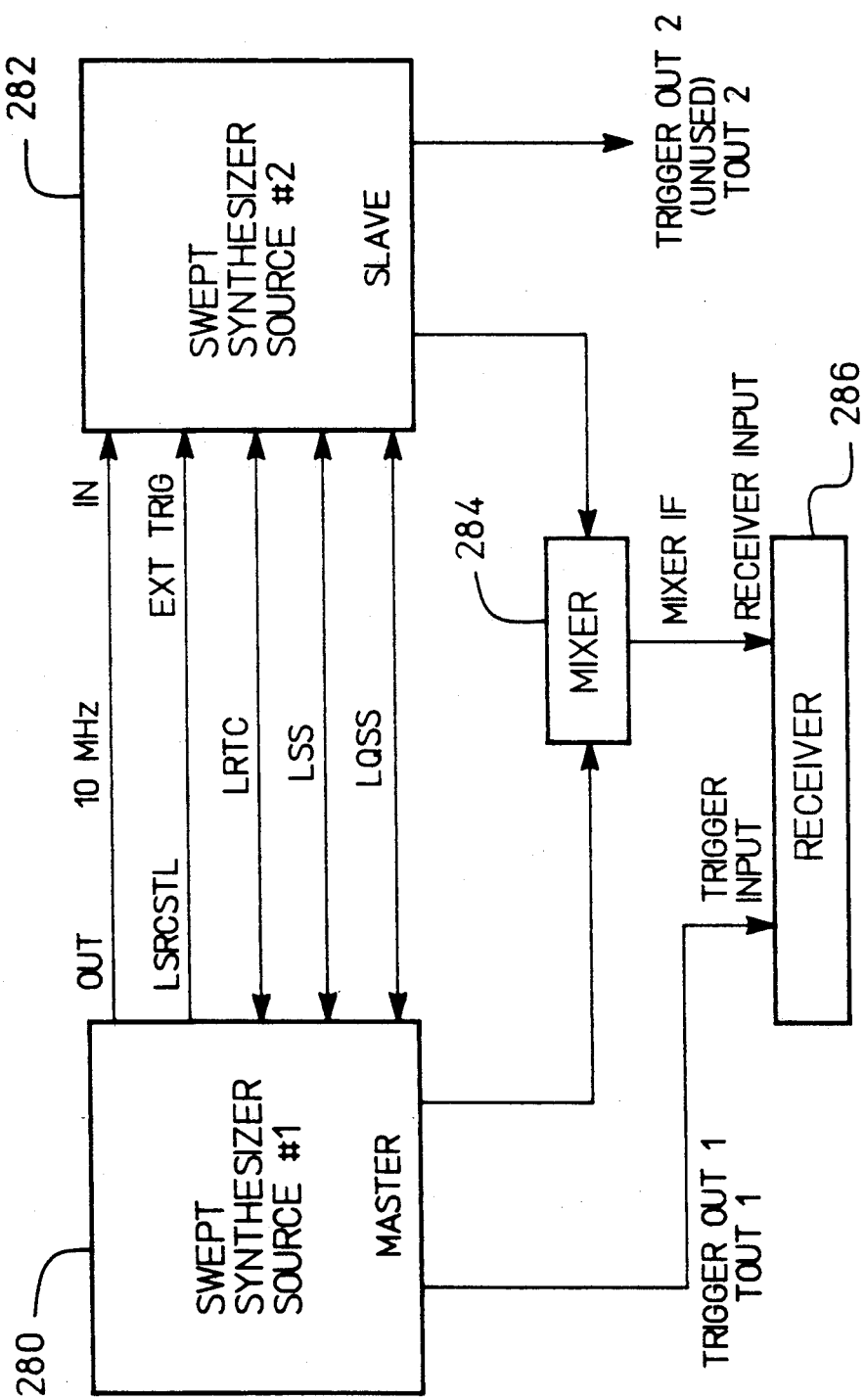
FIG. 12 is a simplified block diagram illustrating the use of two sources to test a mixer.

An example of a configuration to test a mixer is shown in FIG. 12. A first swept synthesizer source 280 is interconnected with a second swept synthesizer source 282 to provide synchronization. The signals interconnecting sources 280 and 282 include the 10 megahertz reference, LSRCSTL, LRTC, LSS, and LQSS signals. The source 280 provides a 10 megahertz reference for the source 282. The RF outputs of each source are connected to the inputs of a mixer 284. The IF output of mixer 284 is connected to the RF input of a receiver 286. The TRIGGER OUTPUT digital synchronizing pulse from source 280 is connected to the trigger input of receiver 286.

Figure 13:
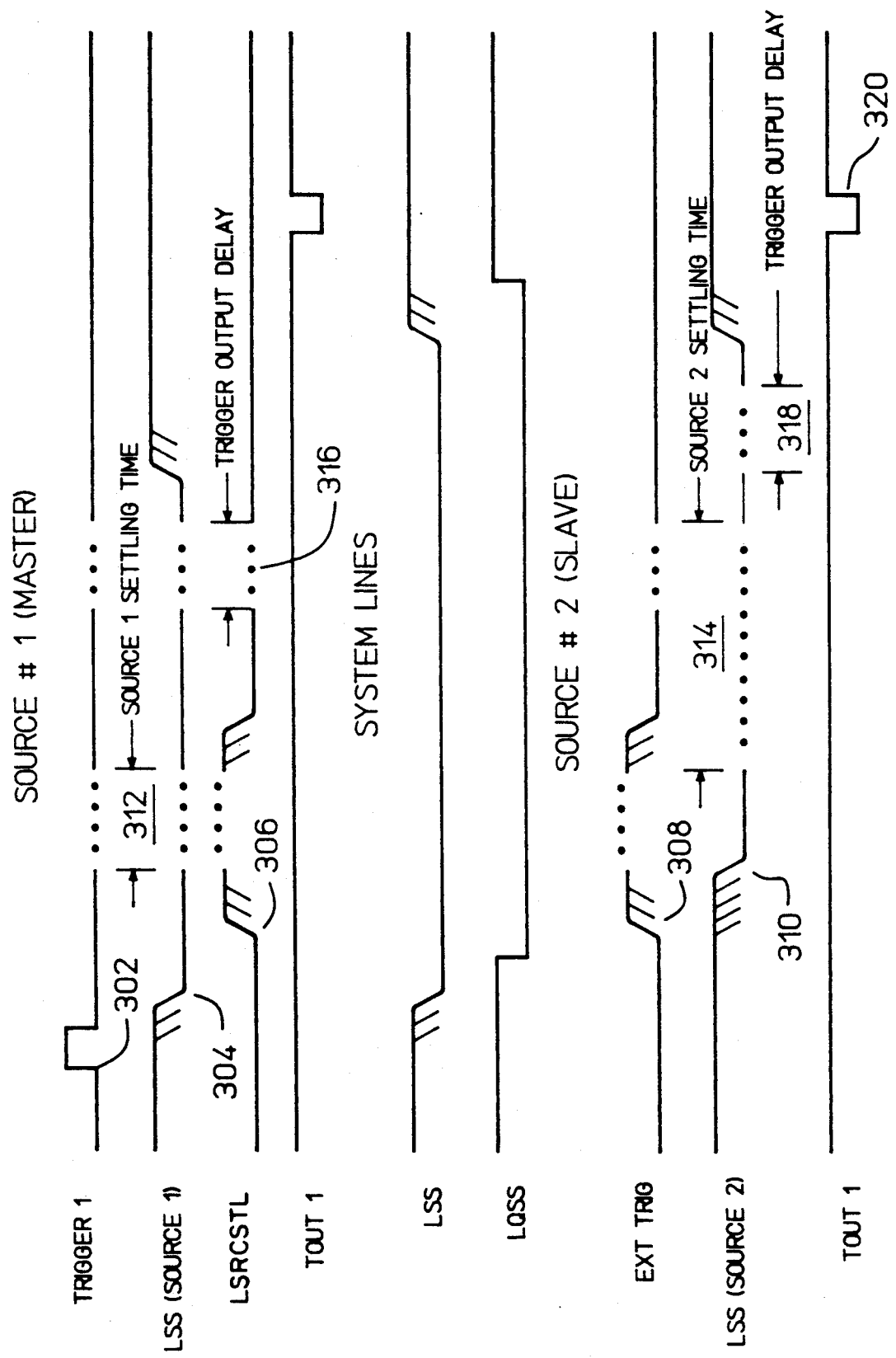
FIG. 13 is a timing diagram illustrating a stepped sweep.

A stepped sweep synchronization timing diagram is shown in FIG. 13. The step is initiated via the HP-IB interface bus, by hardware with the EXT TRIG signal or via a free-running timer, at time 302. The process of stepping to the next point has begun. The first action is to assert the LSS signal at time 304 in order to prevent any other devices in the system from generating a TRIGGER OUTPUT pulse. This also causes LQSS to be asserted. The LSRCSTL line is driven high at time 306 indicating that the source is not settled. The EXT TRIG input goes high at time 308 since it is connected to the LSRCSTL line of source 1. This causes the second source to initiate a step while the first source is also stepping. The LSS line is asserted by source 2 at time 310 since it is not prepared to send the TRIGGER OUTPUT pulse at this time.

Source 1 is in the process of changing to the next frequency during time 312. The required time is unpredictable and varies with frequency. Eventually, source 1 settles and asserts the LSRCSTL line. Source 2 is settling during time 314. In this example, source 2 is much slower than source 1 at this particular frequency. Source 1 enters into a wait state during time 316 in which it dwells for the amount of time specified by the TRIGGER OUTPUT delay. After the TRIGGER OUTPUT delay, source 1 is ready to assert TOUT so it releases the assertion of LSS source 1 and then waits until the LQSS line is high before issuing a TOUT pulse. Source 2 finally settles and then it too dwells by a time 318 equal to the TRIGGER OUTPUT delay. Source 2 continues to assert LSS and LQSS during this time which prevents source 1 from sending a TOUT pulse. When source 2 has finished dwelling, the IF of the mixer is guaranteed to have been present for at least the amount of time specified by the TRIGGER OUTPUT delay. Source 2 releases the LSS line and waits until the LQSS line is high. The LQSS line goes high after source 2 releases the LSS line. Both sources then generate TOUT pulses at the same time 320. Either or both of these signals are used to trigger data taking by the receiver.

The digital synchronization technique described herein eliminates errors due to the conversion of a ramp voltage to a digital pulse train. Periodic calibration of the ramp voltage relative to the digital synchronization signal provides greater accuracy in the linear sweep mode than can be achieved by converting the analog ramp voltage to a digital pulse train. Synchronizing and calibrating an analog integrator sweep generator to digital synchronization signals results in a ramp voltage with very low differential nonlinearity as compared with stepping a DAC, as has been done in prior art systems. Step-to-step frequency variations in the latter system produce unacceptable phase and group delay errors. Also, a simple stepped DAC sweep produces large jumps in frequency which can cause tracking and accuracy problems in various systems. When a programmable filter is added to the output of the DAC to smooth out the jumps and reduce the differential nonlinearity, stopping the sweep causes large errors in the sweep ramp. By contrast, the integrator based sweep system can be stopped with very little ramp error.

A technique for correcting the ramp voltage during a frequency sweep has been described hereinabove. The ramp voltage, after correction, accurately sweeps between the desired limits, typically 0 to 10 volts. When the ramp voltage is applied to the YTO 20, a swept frequency output is produced. The output frequency thus increases as a function of time. Ideally, the frequency increases linearly between a selected start frequency $F_{SRT}$ and a selected stop frequency $F_{STP}$ as indicated by frequency plot 330 in FIG. 14. In a practical system, however, errors are caused by circuit tolerances, temperature variations, YTO nonlinearities, and the like. As a result, the actual frequency sweep as a function of time, as indicated by frequency plot 332, differs from the ideal frequency plot 330. Errors can occur both in the start frequency $F_{SRT}$ and the slope of the frequency plot. Furthermore, the frequency as a function of time can be nonlinear. In order to ensure precise synchronization between the instantaneous output frequency of the source and the digital synchronization pulses, the frequency plot 332 is corrected to approximate the ideal frequency plot 330 as closely as possible. The correction involves adjustment both of the start frequency $F_{SRT}$ and the slope of the frequency plot. If the start frequency $F_{SRT}$ and the slope are accurate, then the stop frequency $F_{STP}$ is accurate, except for nonlinearities. A technique for correcting the start frequency $F_{SRT}$ is disclosed in U.S. Pat. No. 4,130,808 issued Dec. 19, 1978 to Marzalek, which patent is hereby incorporated by reference.

Figure 14:
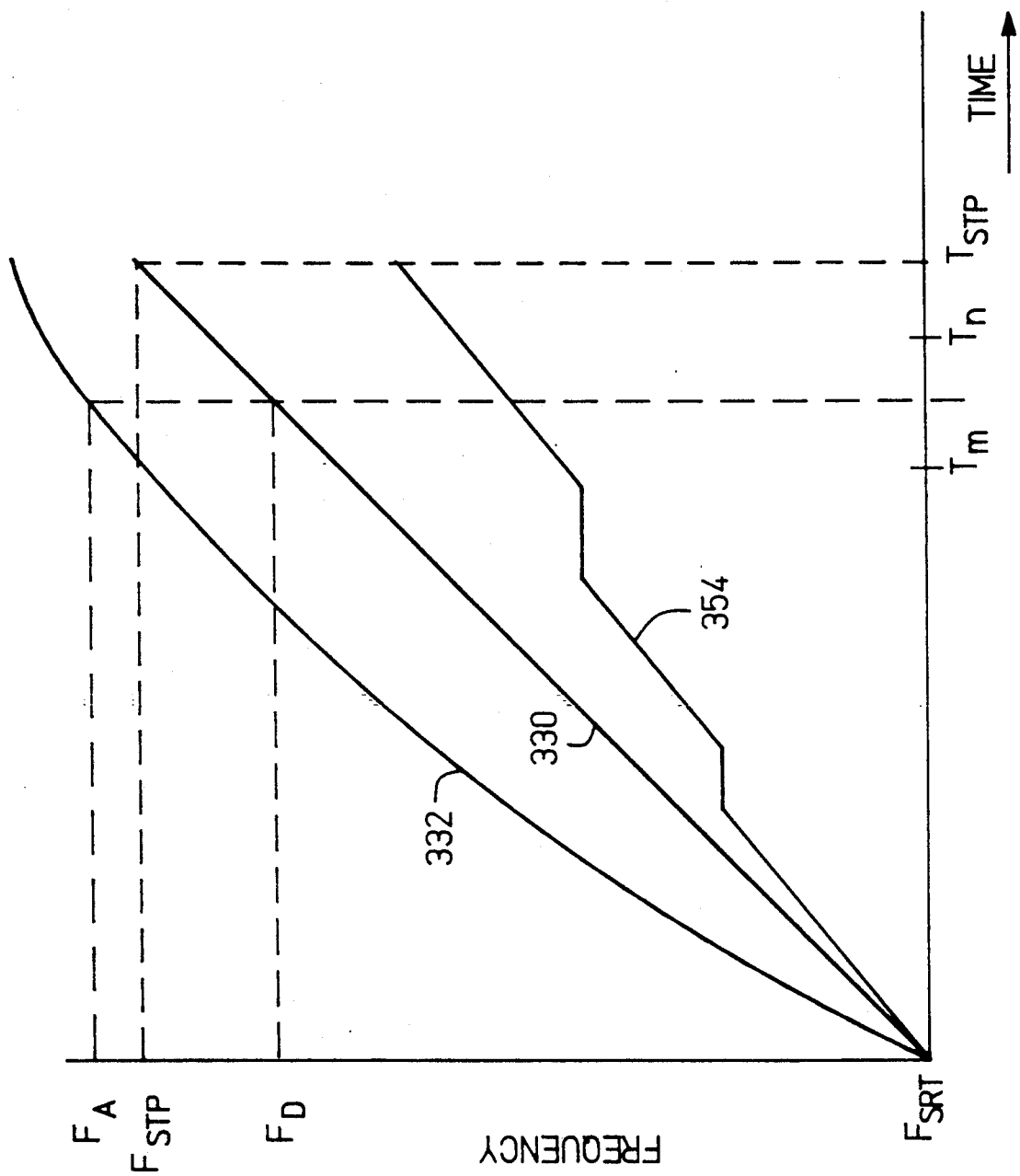
FIG. 14 is a timing diagram illustrating frequency slope correction.
Figure 15A:
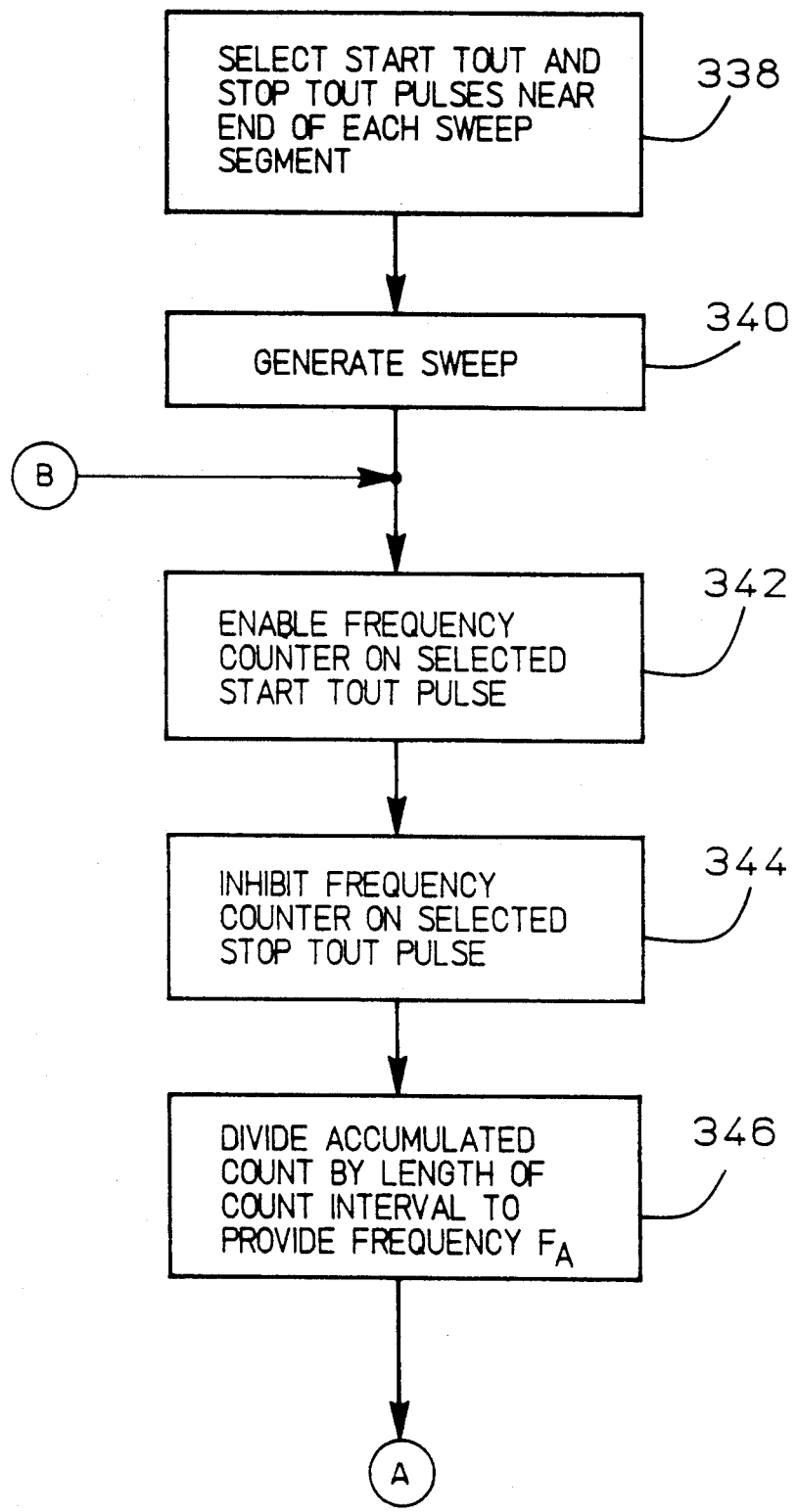
FIGS. 15A and 15B are flow diagrams illustrating slope correction in accordance with the present invention.
Figure 15B:
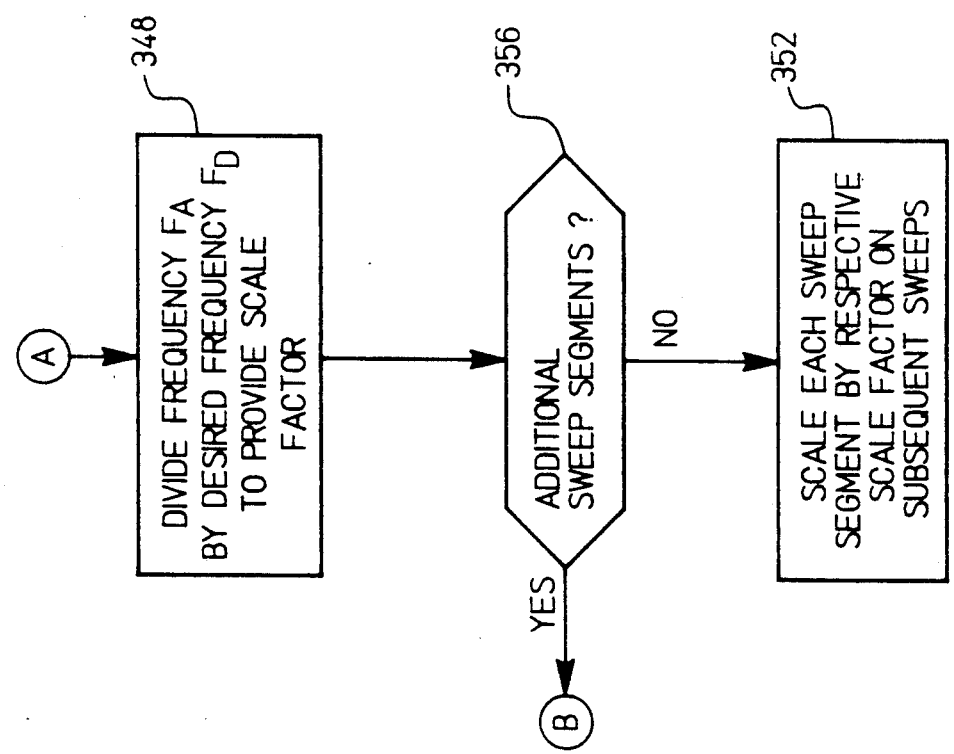

A novel technique for correcting slope of the frequency plot is described with reference to FIGS. 14, 15A and 15B. A flow diagram of the slope correction technique is shown in FIGS. 15A and 15B. The frequency counter 66 shown in FIG. 1 is used in conjunction with the digital synchronization pulses (TRIGGER OUTPUT) to measure the actual frequency output of the YTO 20 at a predetermined time during the sweep. The counter 66 is enabled for a predetermined time between a first, or start, synchronization pulse and a second, or stop, synchronization pulse. The start and stop synchronization pulses are selected in step 338, preferably toward the end of the sweep. The start and stop synchronization pulses are indicated in FIG. 14 as occurring at times $T_m$ and $T_n$, respectively. A sweep is initiated as indicated by step 340. When the sweep reaches time $T_m$, the frequency counter 66 is enabled in step 342 in response to the start synchronization pulse. The counter 66 accumulates counts from time $T_m$ to time $T_n$, at which time the stop synchronization pulse causes counter 66 to be inhibited in step 344. Referring again to FIG. 3, the selected start and stop times for enabling counter 66 are stored in locations in sweep RAM 90 which are addressed by the start and stop synchronization pulses. As the sweep progresses, the digital synchronization pulses cause counter 88 to successively address locations in sweep RAM 90. When the start synchronization pulse occurs, a bit is latched into event latch 92 which causes the ENIFCTR line to be asserted. The ENIFCTR line remains asserted, thereby enabling counter 66, until the stop synchronization pulse occurs. At this time, the ENIFCTR line is reset and the counter 66 is inhibited in step 344.

The count accumulated in counter 66 between tim $T_m$ and $T_n$ is forwarded to CPU 96, and the accumulated count is divided by the length of the count interval between times $T_m$ and $T_n$ in step 346. The result is an average frequency at the center of the counting interval between times $T_m$ and $T_n$. Thus, the frequency at the center of the counting interval is determined by frequency counting while the sweep is in progress and without stopping the sweep. The actual measured frequency $F_A$ is divided by a desired or ideal frequency $F_D$ at the time during the sweep corresponding the center of the counting interval in step 348. The ratio of the actual frequency $F_A$ to the desired frequency $F_D$ is a scale factor. Assuming the sweep has only one segment, the scale factor is applied to a scaling DAC 350 in the YTO driver 34 (FIG. 2) to correct the slope of the frequency plot in step 352. On subsequent sweeps, the actual frequency plot closely approximates the ideal frequency plot 330.

The above discussion has assumed that the frequency sweep was continuous from the start frequency $F_{SRT}$ to the stop frequency $F_{STP}$. In many cases, band changes are required during the sweep, thereby causing the sweep to be temporarily stopped while oscillators are switched and the output of the new oscillator settles. Thus, in general, a sweep consists of several sweep segments with intervening delays, as indicated by frequency plot 354 in FIG. 14. In this case, the slope correction technique described above is applied individually to each sweep segment to improve accuracy. Appropriate start and stop synchronization pulses to control counter 66 are selected for each sweep segment. During a first sweep, the counter 66 is enabled during a counting interval between a start and stop synchronization pulse for each sweep segment. The accumulated counts are used to determine a scale factor for each sweep segment. During subsequent sweeps, the scale factor is applied to the scaling DAC 350 during that sweep segment.

Referring again to FIG. 15B, after the scale factor has been determined for a first sweep segment in step 348, it is determined in step 356 whether there are additional segments in the sweep. If additional sweep segments are required, steps 342, 344, 346 and 348 are repeated for each segment. If there are no additional sweep segments, the slope correction is complete, and the scale factors are applied to the scaling DAC 350 on subsequent sweeps in step 352.

The slope correction technique described above can be employed iteratively on successive sweeps to reduce slope errors. However, the corrections can produce momentary phase and frequency deviations in the RF output. Therefore it is preferred to perform the slope correction procedure once during a first sweep and to utilize the same corrections until a different sweep is selected by the user.

The so called "lock and roll" correction technique described in the aforementioned U.S. Pat. No. 4,130,808 only corrects the start of each sweep segment in a multi band frequency sweep, leaving the slope of the sweep in error. Applying slope correction as described above can theoretically eliminate all slope errors that are not due to nonlinearities of the oscillator. Given the high linearity of YTO's, slope correction can typically achieve a 10:1 slope accuracy improvement in wide sweeps over a basic lock and roll sweep.

The slope correction technique also makes the frequency at the end of one sweep segment equal to the frequency at the beginning of the next segment. This feature has value in phase and group delay measurements by a network analyzer, even if there is some nonlinearity in the sweep segments. When measuring electrically long devices and slope correction is not employed, the resulting phase and group delay discontinuities at band cross points in uncorrected sweep segments can be a problem.

Precision sweep signal sources typically utilize automatic level correction to ensure that the power level, either at the output of the instrument or at a remote measurement site, remains constant as the output frequency is swept. Automatic leveling is particularly necessary in microwave frequency sweepers where the power level is highly sensitive to parasitic impedances and often decreases with increasing frequency. Furthermore, leveling can be important where it is desirable to provide a constant level at a remote location external to the instrument, such as the input to a device under test. In this case, interconnecting cables, attenuators and other components usually cause a further variation in power level as a function of frequency.

The digital synchronization technique described herein enables ultra precise leveling to be achieved. While a constant power level as a function of frequency is usually desired, it will be understood that the power level can be increased or decreased with frequency, while being precisely controlled. In accordance with a further feature of the present invention, there is provided a technique for achieving precision leveling utilizing predefined correction parameters. Precision leveling is provided for any selected sweep parameters within the range of the predefined correction parameters.

Figure 16:
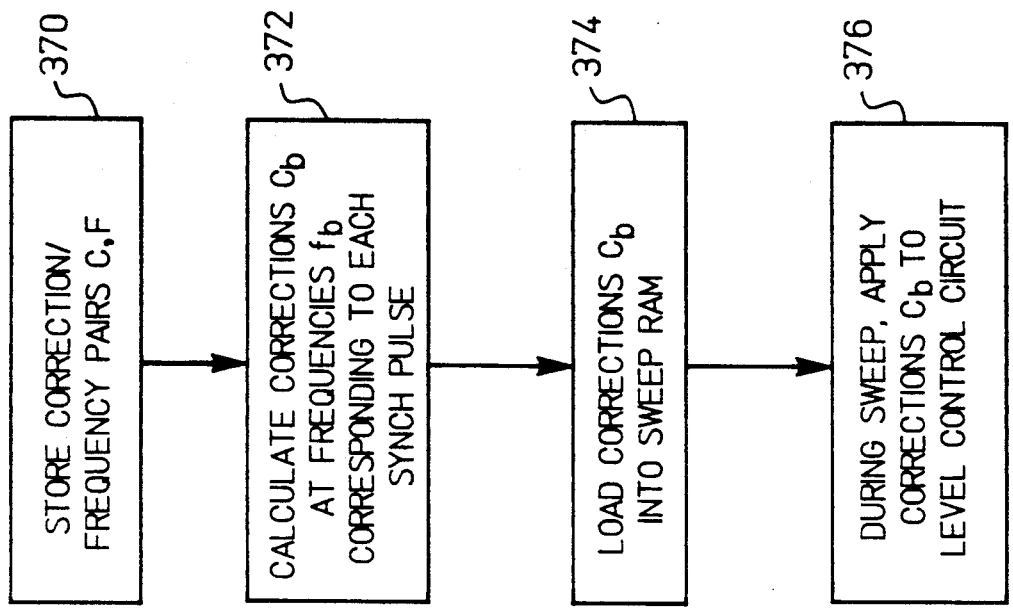
FIG. 16 is a flow diagram illustrating interpolated level correction in accordance with the present invention.

The basic steps involved in achieving ultra precise leveling are shown in the flow diagram of FIG. 16. Initially, a table of correction/frequency pairs are obtained by measurement and are stored by the CPU 96 in step 370. Each of the correction/frequency pairs C,F consists of a frequency F within the range of the swept synthesizer source and a correction C for that frequency. As few as one, or as many as 801 correction/frequency pairs can be stored. The correction/frequency pairs can be obtained by measurements either at the output of the swept synthesizer source or at a specified remote location. The correction/frequency pairs can be measured automatically using a power meter. Each correction is determined by setting the source frequency to the corresponding frequency and measuring the power level at the specified local or remote location. The difference between the measured power level and the desired power level is the correction C for that frequency. While it is not necessary that the correction/frequency pairs cover the entire operating range of the source, corrections will be applied only within the frequency range covered by the correction/frequency pairs.

When sweep parameters, including start and stop frequencies and power level, are selected by the user of the instrument, it is necessary to determine level corrections at frequencies corresponding to each of the digital synchronization pulses. In the example described herein, 1601 digital synchronization pulses are generated per sweep, regardless of the sweep time or the start and stop frequencies. In step 372, corrections are calculated at frequencies corresponding to each digital synchronization pulse by a linear interpolation technique to be described hereinafter. The 1601 calculated corrections are loaded by the CPU 96 into the sweep RAM 90 in step 374. During each sweep, the digital synchronization pulses cause counter 88 to successively address locations in sweep RAM 90 and to read out the correction values to ALC reference DAC and track/hold 94 in step 376. The correction values are applied to the automatic level control 62 (FIG. 1) to thereby effect the desired level correction.

Figure 17:
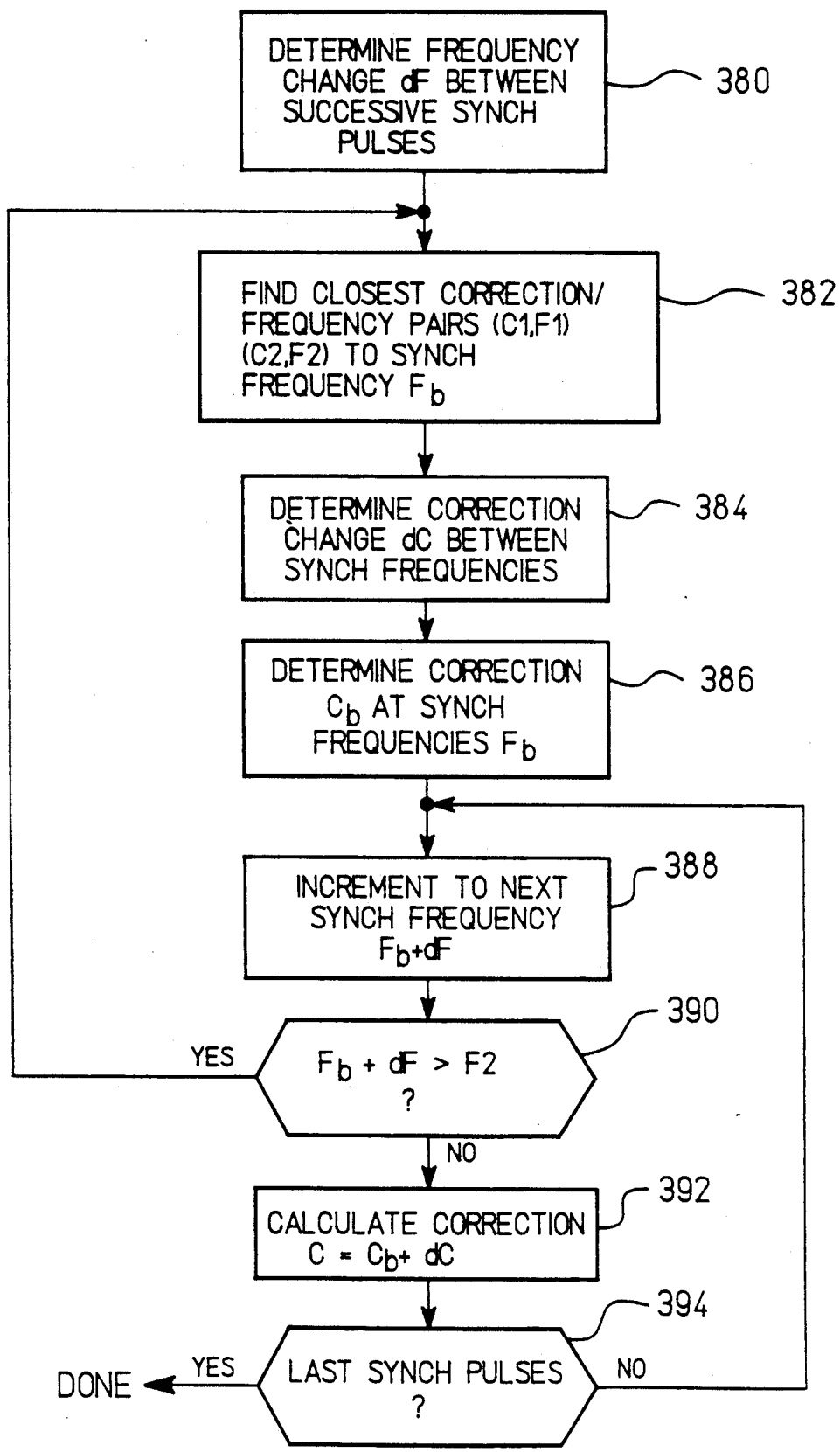
FIG. 17 is a flow diagram illustrating the interpolation algorithm used for level correction.

The linear interpolation technique for calculating corrections at frequencies corresponding to each digital synchronization pulse is described with reference to the flow diagram of FIG. 17. The following is an example of an array of correction/frequency pairs which have been measured and entered into the instrument. The undefined correction in the table simply indicates that a frequency was entered without a corresponding correction. Undefined corrections are ignored in the interpolation technique.

| Frequency (Megahertz) | Correction (dB) |
| --- | --- |
| 2300 | 1.2 |
| 4300 | 1.4 |
| 5000 | 2.0 |
| 5200 | undefined |
| 5600 | 0.8 |
| 7000 | 0.3 |

In a first example, assume that the source is operating in a nonsweep mode at a fixed frequency of 5.3 gigahertz. The two nearest defined frequencies that bracket the desired frequency of 5.3 gigahertz, are 5 gigahertz and 5.6 gigahertz. The correction/frequency pair of lower frequency is denoted by C1, F1, and the upper frequency pair is denoted by C2, F2. The correction at the fixed frequency of 5.3 gigahertz is calculated as follows.

$$tC = [(C2-C1)/(F2-F1)] * (F-F1) + C1 \quad (1)$$

where C denotes the correction, and F denotes the corresponding frequency (5.3 gigahertz). In the above example, C is calculated as 1.4 dB.

In swept mode applications, it is necessary to determine correction values at frequencies corresponding to each digital synchronization pulse (1601 in the preferred embodiment). The corrections can be determined at each of the 1601 frequencies using Equation (1) above. Equation (1) can be modified as follows.

$$C_b = [(C2-C1)/(F2-F1)] * (F_b-F1) + C1 \quad (2)$$

where $C_b$ represents the correction at a particular synchronization pulse and $F_b$ represents the frequency at that synchronization pulse. The frequency $F_b$ is determined as follows.

$$F_b = [(F_{STP}-F_{SRT})/1600] * N + F_{SRT} \quad (3)$$

Where $F_{STP}$ and $F_{SRT}$ represent the stop and start frequencies, respectively, of the sweep, and N represents the number of the synchronization pulse. By combining Equations (2) and (3), the correction $C_b$ corresponding to each synchronization pulse can be determined.

In practice, it is inefficient to repeat the above calculations for each of the 1601 synchronization pulses. Examination of the first term of the correction calculation of equation (2) indicates that it is the slope of the line drawn between the two correction points in the table. This term does not change until the frequency $F_b$ becomes greater than F2. At this time, F1 and F2, the nearest defined points in the correction/frequency table, must be redetermined. Since the frequency spacing between adjacent synchronization pulses is constant for a given sweep, a more efficient interpolation algorithm can be utilized as described below with reference to FIG. 17.

The frequency change dF that occurs between each pair of synchronization pulses is determined in step 380 from dF = ($F_{STP}-F_{SRT}$)/1600). The frequency change dF is constant over the interpolation procedure. It is noted that the frequency $F_b$ at the first synchronization pulse equals the start frequency $F_{SRT}$. Next, the nearest correction/frequency pairs that bracket $F_b$ the first synchronization frequency are found in step 382. The correction change dC corresponding to the frequency change dF between synchronization pulses is determined in step 384 as follows.

$$dC = [(C2-C1)/(F2-F1)] * dF \quad (4)$$

The correction value $C_b$ at the first synchronization frequency $F_b$ is determined using Equations (2) and (3) in step 386. The next synchronization frequency is determined by adding $F_b$+dF in step 388. Then, the new synchronization frequency $F_b$+dF is compared with the frequency F2 of the upper correction/frequency pair in step 390. If the new synchronization frequency is greater than F2, then steps 382, 384, 386, 388 and 390 are repeated. If the new frequency $F_b$+dF does not exceed F2, then a correction C at that frequency is determined in step 392 by adding the correction change dC to the previously calculated correction (C=$C_b$+dF). Steps 388, 390 and 392 are repeated for each synchronization frequency, with steps 382-390 being repeated as necessary until the correction values have been determined for each of the 1601 synchronization frequencies. The above-described technique minimizes the number of divisions that must be performed and thereby provides a significant decrease in calculation time.

The following special cases are noted in connection with the level correction technique. When the synchronization frequency $F_b$ is exactly equal to one of the correction frequencies that were initially stored, then it is not necessary to perform interpolation, and the associated correction value is supplied. If the selected start or stop frequencies are outside the range of the correction/frequency pairs that were entered, then no correction is supplied for those values of $F_b$ that lie outside the range of the correction/frequency pairs.

The parameter correction technique has been described above in connection with power level correction. The same technique can be utilized for correcting other parameters that are frequency dependent. The parameter correction technique enables the swept frequency synthesizer to achieve greater accuracy in either stepped or continuous sweeps than was possible in the prior art. Automatic interpolation when sweep parameters are changed makes the technique easy to use. The power level accuracy is limited only by the accuracy of the power meter used to calibrate the system and by temperature drifts of the leveling circuitry. The speed of the interpolation algorithm permits leveling to be applied automatically, even when sweep parameters are altered, without repeating calibrations. Tables of corrections/frequency pairs can be stored for different attenuator settings, different equipment setups and for both local and remote leveling.

While there have been shown and described what are at present considered the preferred embodiments of the present invention, it will be obvious to those skilled in the art that various changes and modifications may be made therein without departing from the scope of the invention as defined by the appended claims.

---

APPENDIX A

The logic description of the Sweep Control PAL is described below. The symbol ":=" is used to mean "is evaluated at a clock edge to be equal to".

```
/CTRCLK := FNSWP*/ENEXTSS*CTRCLK*/QSS_DRV*/LFNGO
 + /FNSWP*/CTRCLK
 + RESET
 + QSS_SNS*ENEXTSS*/CTRCLK
 + FNSWP*/QSS_SNS*CTRCLK*/QSS_DRV*/LFNGO
 + /CTRCLK*QSS_DRV
 + /CTRCLK*LFNGO
/HRST := /RESET*/HRST
 + FNSWP*/QSS_SNS*/RESET*/QSS_DRV*/LFNGO
 + FNSWP*/RESET*/ENEXTSS*/QSS_DRV*/LFNGO
```

-continued

APPENDIX A

The logic description of the Sweep Control PAL is described below. The symbol ":=" is used to mean "is evaluated at a clock edge to be equal to".

```
/HSWP := /FNSWP
+ QSS_SNS*ENEXTSS
+ RESET
+ QSS_DRV
+ LFNGO
/LBLANK := /FNSWP*/ZON
+ QSS_SNS*/ZON
+ RESET*/ZON
+ /ENEXTSS*/ZON
+ /ZON*QSS_DRV
+ /ZON*LFNGO
/LFNGO := /QSS_SNS*/RESET*/QSS_DRV
+ /RESET*/ENEXTSS/QSS_DRV
/LINTBKT := FNSWP*/QSS_SNS*/RESET*HRST*/QSS_DRV*/LFNGO*LINTBKT
+ FNSWP*/RESET*/ENEXTSS*HRST*/QSS_DRV*/LFNGO*LINTBKT
+ FNSWP*/QSS_SNS*/RESET*/LCTROUT*/QSS_DRV*/LFNGO*LINTBKT*HSWP
+ FNSWP*/RESET*/ENEXTSS*/LCTROUT*/QSS_DRV*/LFNGO*LINTBKT*HSWP
/QSS_DRV := /RESET*/SS_SNS
```

What is claimed is:

1. A method for correcting a frequency-dependent parameter in a swept frequency signal source having selectable start and stop frequencies, said method comprising the steps of:
   storing a first table of parameter correction values corresponding to a set of first frequencies within the sweep range of said signal source;
   defining a set of second frequencies between a selected start frequency and a selected stop frequency of a sweep;
   calculating a parameter correction value for each of said second frequencies from said first table of parameter correction values, said correction values for each of said second frequencies constituting a second table of parameter correction values; and
   correcting said parameter as said signal source is swept between said start and stop frequencies using said second table of correction values.

2. A method as defined in claim 1 wherein the step of calculating a second table of parameter correction values includes interpolation between said correction values in said first table.

3. A method as defined in claim 1 including the step of generating a digital synchronization signal to which a sweep by said signal source is synchronized, said digital synchronization signal including a predetermined number of digital pulses during a sweep, one of said second frequencies being synchronized to each of said digital pulses.

4. A method as defined in claim 3 wherein said second frequencies are equally spaced.

5. A method as defined in claim 4 further including the step of storing said second table of parameter correction values in a memory.

6. A method as defined in claim 5 wherein the step of correcting said parameter includes the steps of
   sequentially addressing said memory upon the occurrence of said digital synchronization pulses during a sweep, and
   applying the parameter correction values that are read out from said memory to a level correction circuit.

7. A method as defined in claim 1 wherein the step of calculating a correction value for each of said second frequencies includes the steps of
   finding in said first table the parameter correction values at the closest frequencies above and below each of said second frequencies, and
   determining a correction value at each of said second frequencies by interpolation between the parameter correction values at the closest frequencies in said first table.

8. A method as defined in claim 4 wherein the step of calculating a correction value for each of said second frequencies includes the steps of
   calculating a correction value at one of said second frequencies by linear interpolation between a first correction value and a second correction value in said first table, said first and second correction values corresponding to the closest frequencies above and below said one of said second frequencies,
   calculating a change in correction value dC between adjacent second frequencies,
   incrementing to the next of said second frequencies in the direction of said first correction value,
   when the next of said second frequencies does not exceed the frequency corresponding to said first correction value in said first table, calculating the next correction value by summing the previous correction value C with the change in correction value dC, and
   when the next of said second frequencies exceeds the frequency corresponding to said first correction value in said first table, calculating the next correction value by linear interpolation between a third correction value and a fourth correction value in said first table, said third and fourth correction values corresponding to the closest frequencies above and below the next of said second frequencies.

9. A method as defined in claim 8 wherein said parameter correction values comprise power level correction values.

10. Apparatus for correcting a frequency-dependent parameter in a swept frequency signal source having selectable start and stop frequencies, comprising:
    means for storing a first table of parameter correction values corresponding to a set of first frequencies within the sweep range of said signal source;

means for defining a second set of frequencies between a selected start frequency and a selected stop frequency of a sweep;

means for calculating a parameter correction value for each of said second frequencies from said first table of parameter correction values, said correction values for each of said second frequencies constituting a second table of parameter correction values; and means for correcting said parameter as said signal source is swept between said start and stop frequencies using said second table of correction values.

11. Apparatus as defined in claim 10 wherein said means for calculating a second table of parameter correction values includes means for interpolation between said correction values in said first table.

12. Apparatus as defined in claim 10 including means for generating a digital synchronization signal to which a sweep by said signal source is synchronized, said digital synchronization signal including a predetermined number of digital pulses during a sweep, one of said second frequencies being synchronized to each of said digital pulses.

13. Apparatus as defined in claim 12 wherein said second frequencies are equally spaced.

14. Apparatus as defined in claim 13 further including memory means for storing said second table of parameter correction values.

15. Apparatus as defined in claim 14 wherein said means for correcting said parameter includes means for sequentially addressing said memory means upon occurrence of said digital synchronization pulses during a sweep, and means for applying the parameter correction values that are read out from said memory means to a level correction circuit.

16. Apparatus as defined in claim 10 wherein said means for calculating a correction value for each of said second frequencies includes means for finding in said first table the parameter correction values at the closest frequencies above and below each of said second frequencies, and means for determining a correction value at each of said second frequencies by interpolation between the parameter correction values at the closest frequencies in said first table.

17. Apparatus as defined in claim 13 wherein said means for calculating a correction value for each of said second frequencies includes means for calculating a correction value at one of said second frequencies by linear interpolation between a first correction value and a second correction value in said first table, said first and second correction values corresponding to the closest frequencies above and below said one of said second frequencies, means for calculating a change in correction value between adjacent second frequencies, means for incrementing to the next of said second frequencies in the direction of said first correction value, means for calculating the next correction value by summing the previous correction value with the change in correction value when the next of said second frequencies does not exceed the frequency corresponding to said first correction value in said first table, and means for calculating the next correction value by linear interpolation between a third correction value and a fourth correction value in said first table when the next of said second frequencies exceeds the frequency corresponding to said first correction value in said first table, said third and fourth correction values corresponding to the closest frequencies above and below the next of said second frequencies.

* * * * *